United States Patent
Katsura

(10) Patent No.: US 9,333,914 B2
(45) Date of Patent: May 10, 2016

(54) LED SHORT-CIRCUIT DETECTION CIRCUIT, LED DRIVE DEVICE, LED LIGHTING DEVICE, AND VEHICLE

(75) Inventor: Koji Katsura, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 625 days.

(21) Appl. No.: 13/349,750

(22) Filed: Jan. 13, 2012

(65) Prior Publication Data

US 2012/0181931 A1  Jul. 19, 2012

(30) Foreign Application Priority Data

Jan. 13, 2011 (JP) .................. 2011-004495
Dec. 28, 2011 (JP) .................. 2011-289358

(51) Int. Cl.
*B60Q 1/02* (2006.01)
*B60Q 11/00* (2006.01)
*G01R 31/26* (2014.01)
*H05B 33/08* (2006.01)
*G01R 31/02* (2006.01)

(52) U.S. Cl.
CPC .......... *B60Q 11/005* (2013.01); *G01R 31/2635* (2013.01); *H05B 33/0887* (2013.01); *G01R 31/025* (2013.01)

(58) Field of Classification Search
CPC .......... H01L 2224/48091; H01L 2924/00014;
H01L 25/0753; H01L 2924/00; H01L 2924/0002; H01L 25/167; H01L 27/156; H01L 2924/13091; H01L 33/62; H01L 24/82; H01L 27/153; H01L 2924/01015; H01L 2924/0102
USPC ................ 315/77–82; 362/257; 307/9.1–10.8
See application file for complete search history.

(56) References Cited

U.S. PATENT DOCUMENTS

| | | | |
|---|---|---|---|
| 7,903,197 B2 * | 3/2011 | Koganezawa | 349/65 |
| 2002/0047636 A1 * | 4/2002 | Yamamoto et al. | 315/291 |
| 2006/0170287 A1 | 8/2006 | Ito et al. | |
| 2007/0170876 A1 | 7/2007 | Ito et al. | |

FOREIGN PATENT DOCUMENTS

| | | |
|---|---|---|
| JP | 2006-210219 | 8/2006 |
| JP | 2007-200610 | 8/2007 |
| JP | 2008-084614 | 4/2008 |
| JP | 2012-133954 | 7/2012 |

* cited by examiner

*Primary Examiner* — Douglas W Owens
*Assistant Examiner* — Monica C King
(74) *Attorney, Agent, or Firm* — Fish & Richardson P.C.

(57) ABSTRACT

An LED short-circuit detection circuit produces an LED short-circuit detection signal by monitoring an LEDC terminal voltage (a first voltage obtained at a chip-to-chip node in a row of LED chips, or a divided voltage thereof) and an LEDR terminal voltage (a second voltage obtained by dividing the end-to-end voltage of the row of LED chips).

6 Claims, 24 Drawing Sheets

FIG.3

| PIN NO. | TERMINAL NAME | FUNCTION |
|---|---|---|
| 1 | COMP | ERROR AMP OUTPUT TERMINAL |
| 2 | SS | SOFT START TERMINAL |
| 3 | VCC | INPUT POWER-SOURCE TERMINAL |
| 4 | EN | ENABLE TERMINAL |
| 5 | RT | OSCILLATION FREQUENCY SETTING RESISTOR CONNECTION TERMINAL |
| 6 | SYNC | EXTERNAL SYNCHRONIZATION SIGNAL INPUT TERMINAL |
| 7 | GND | SMALL SIGNAL PORTION GND TERMINAL |
| 8 | THM | THERMISTOR CONNECTION TERMINAL |
| 9 | FB | ERROR AMP FB SIGNAL INPUT TERMINAL |
| 10 | DISC | CR TIMER DISCHARGE TERMINAL |
| 11 | VTH | CR TIMER THRESHOLD TERMINAL |
| 12 | DRLIN | DRL CHANGEOVER TERMINAL (PULSE OUTPUT SETTING TERMINAL) |
| 13 | FAIL1 | OUTPUT TERMINAL AT A TROUBLE TIME |
| 14 | FAIL2 | LED OPEN, SHORT-CIRCUIT TROUBLE OUTPUT TERMINAL |
| 15 | OVP | OVERVOLTAGE DETECTION TERMINAL |
| 16 | LEDC | LED SHORT-CIRCUIT DETECTION TERMINAL (LED DETECTION SIDE) |
| 17 | LEDR | LED SHORT-CIRCUIT DETECTION TERMINAL (RESISTOR DETECTION SIDE) |
| 18 | N.C. | — |
| 19 | PGND | PWM LIGHT ADJUSTMENT DRIVER SOURCE TERMINAL |
| 20 | PWMOUT | PWM LIGHT ADJUSTMENT SIGNAL OUTPUT TERMINAL |
| 21 | CT | GROUND SHORT PROTECTION TIMER TIME SETTING TERMINAL |
| 22 | OUTL | LOW-SIDE EXTERNAL FET GATE DRIVE TERMINAL |
| 23 | DGND | LOW-SIDE FET DRIVER SOURCE TERMINAL |
| 24 | SW | HIGH-SIDE FET SOURCE TERMINAL |
| 25 | OUTH | HIGH-SIDE EXTERNAL FET GATE DRIVE TERMINAL |
| 26 | CS | DC/DC OUTPUT CURRENT DETECTION TERMINAL |
| 27 | BOOT | HIGH-SIDE FET DRIVER POWER-SOURCE TERMINAL |
| 28 | VREG | INTERNAL CONSTANT VOLTAGE OUTPUT TERMINAL |

FIG.11

| PROTECTION FUNCTION | DETECTION CONDITION | | OPERATION DURING DETECTION TIME |
|---|---|---|---|
| | [DETECTION] | [RELEASE] | |
| UVLO | VREG<4.3V | VREG>4.5V | ALL THE BLOCKS (OTHER THAN REG) SHUT DOWN |
| TSD | Tj>175°C | Tj<150°C | ALL THE BLOCKS (OTHER THAN REG) SHUT DOWN |
| OVP | VOVP>2.0V | VOVP<1.45V | SS DRAWING |
| OCP | VCS≦VCC-0.6V | VCS>VCC-0.6V | SS DRAWING |
| SCP | VFB<0.05V (150MS DELAY AT CT = 0.1 $\mu$F) | EN or UVLO | DELAY COUNTER→LATCH OFF(OTHER THAN REG) |
| LED OPEN PROTECTION | VFB<0.05V & VOVP>1.7V | EN or UVLO | ALL THE BLOCKS (OTHER THAN REG) SHUT DOWN |
| LED SHORT-CIRCUIT PROTECTION | |LEDR-LEDC|≧0.2V (100 MS DELAY AT 300 KHZ) | EN or UVLO | DELAY COUNTER→LATCH OFF(OTHER THAN REG) |

LED SHORT-CIRCUIT DETECTION CIRCUIT, LED DRIVE DEVICE, LED LIGHTING DEVICE, AND VEHICLE

CROSS-REFERENCE TO RELATED APPLICATIONS

This application is based on the following Japanese Patent Applications, the content of which is hereby incorporated by reference.
[1] No. 2011-004495 (the filing date: Jan. 13, 2011)
[2] No. 2011-289358 (the filing date: Dec. 28, 2011)

BACKGROUND OF THE INVENTION

1. Field of the Invention

The present invention relates to an LED (Light Emitting Diode) short-circuit detection circuit, an LED drive circuit, an LED lighting device, and a vehicle that use the LED short-circuit detection circuit.

2. Description of Related Art

In a case where a plurality of LEDs are connected in series and are driven, when the LED shorts on one stage, the number of turned-on LEDs decreases by one stage and the brightness of the LED line becomes low as a whole. Especially, in the field of a vehicle lamp, because a brightness shortage is handled as a violation of the law, an LED short-circuit detection circuit is a must.

FIG. 24 is a circuit diagram showing a conventional example of the LED short-circuit detection circuit. The LED short-circuit detection circuit as the conventional example has a structure which uses an external discrete component to compare an output voltage Vout applied to an anode of the LED line and a predetermined detection voltage Vth with each other in absolute value, thereby generating an LED short-circuit detection signal.

Here, as an example of the conventional technology related to the above description, there is JP-A-2008-084614.

However, in the LED short-circuit detection circuit as the conventional example, adjustment of the detection voltage Vth must be performed considering unevenness of a forward drop voltage VF and a temperature characteristic of the LED, so that there is a problem that a management burden during a production process is large.

Besides, in the LED short-circuit detection circuit as the conventional example, to mount the LED short-circuit detection circuit, many external discrete components are necessary, which brings a problem that a board area becomes large.

Here, when the LED short-circuit detection circuit as the conventional example is simply integrated, there is a problem that the adjustment of the detection voltage Vth becomes hard; and the LED short-circuit detection accuracy deteriorates.

SUMMARY OF THE INVENTION

In light of the above problems found by the inventors of the present invention, it is an object of the present invention to provide an LED short-circuit detection circuit that is able to accurately detect an LED short-circuit, and an LED drive device, an LED lighting device and a vehicle that use the LED short-circuit detection circuit.

To achieve the above object, an LED short-circuit detection circuit according to the present invention employs a structure which monitors: a first voltage obtained at a between-chips node of an LED chip line or a divided voltage thereof; and a second voltage obtained by dividing a voltage across the LED chip line, thereby generating a LED short-circuit detection signal.

Here, other features, elements, steps, advantages, and characteristics of the present invention will become more apparent from the following detailed description of preferred embodiments of the present invention with reference to the attached drawings.

BRIEF DESCRIPTION OF THE DRAWINGS

FIG. 3 is a terminal list of the LED driver IC 100.

FIG. 5 is a time chart for describing a PWM start sequence after EN turning-on.

FIG. 11 is a protection function list of the LED driver IC 100.

DETAILED DESCRIPTION OF PREFERRED EMBODIMENTS

<Block Diagram>

Figure 1:
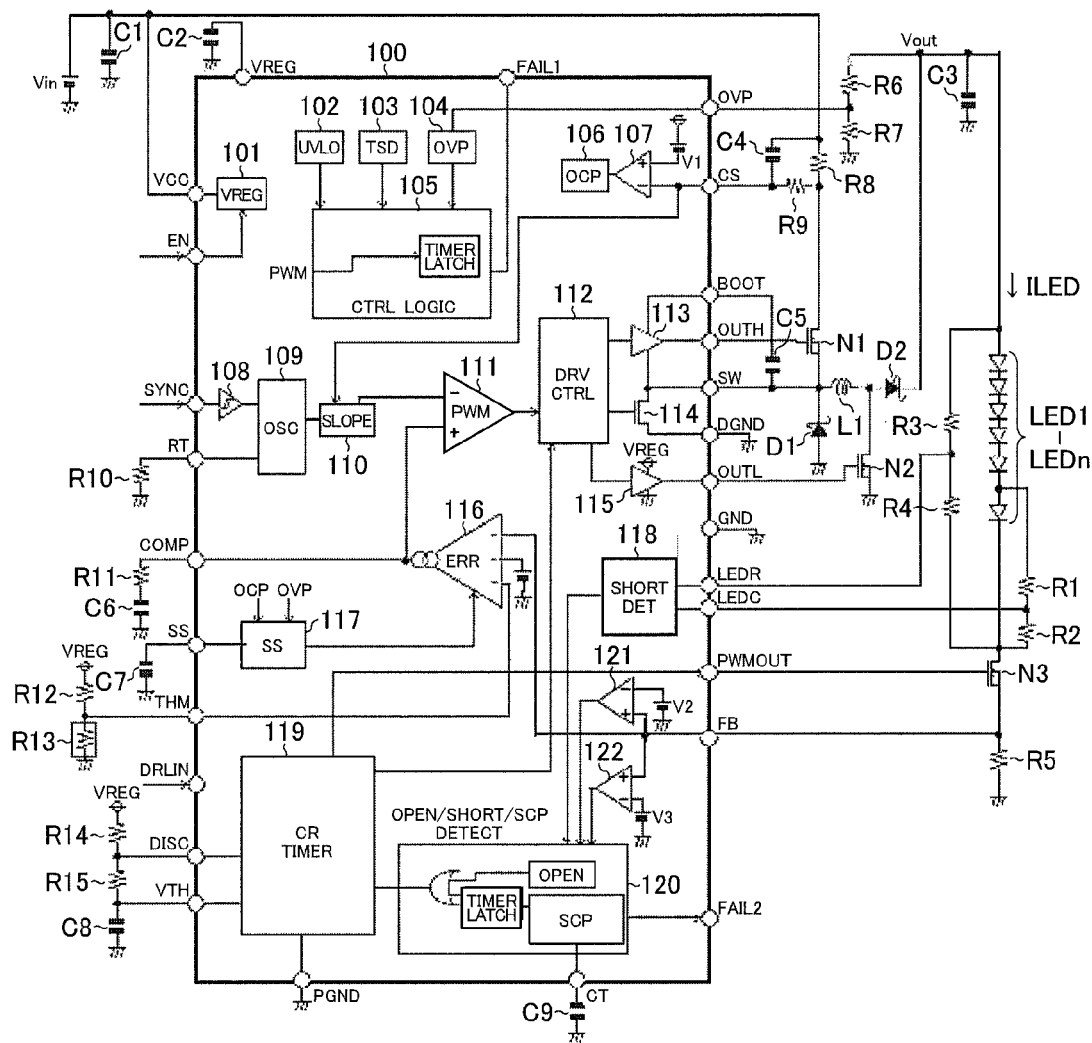
FIG. 1 is a circuit block diagram showing a first structural example (voltage step-up/down application structural example) of an LED driver IC according to the present invention.

FIG. 1 is a circuit block diagram showing a first structural example (voltage step-up/down application structural example) of an LED driver IC according to the present invention. An LED driver IC 100 of the present structural example is a semiconductor device which integrates: an internal constant voltage generation portion 101; an UVLO [Under Voltage Lock Out] portion 102; a TSD [Thermal Shut Down] portion 103; an OVP [Over Voltage Protection] portion 104; a control logic portion 105; an OCP [Over Current Protection] portion 106; a comparator 107; a Schmitt trigger 108; an oscillation portion 109; a slope generation portion 110; a PWM [Pulse Width Modulation] comparator 111; a driver control portion 112; an high-side driver 113; an N channel MOS [Metal Oxide Semiconductor] field effect transistor 114; a low-side driver 115; an error lamp 116; a soft start portion 117; an LED short-circuit detection portion 118; a CR timer portion 119; a various trouble detection portion 120; comparators 121 and 122.

As described above, a switching power-source IC, a microcomputer/counter LSI and a discrete protection circuit, which are conventionally mounted independently on a board, are integrated into the one-chip LED driver IC 100, whereby it becomes possible to achieve reduction in the board area and a low defective rate of the product. Besides, thanks to the board area reduction, it is possible to flexibly deal with a diversified light source design.

Besides, the LED driver IC 100, to secure electrical connection to outside of the IC, has 28 external terminals (COMP, SS, VCC, EN, RT, SYNC, GND, THM, FB, DISC, VTH, DRLIN, FAIL1, FAIL2, OVP, LEDC, LEDR, NC, PGND, PWMOUT, CT, OUTL, DGND, SW, OUTH, CS, BOOT, and VREG).

The internal constant voltage generation portion 101 generates an internal constant voltage VREG (e.g., 5 V) from an input voltage Vin applied to the VCC terminal.

The UVLO portion 102 shuts down the circuits other than the internal constant voltage generation portion 101 when the internal constant voltage VREG becomes 4.3 V or lower.

The TSD portion 103 shuts down the circuits other than the internal constant voltage generation portion 101 when the junction temperature of the LED driver IC 100 becomes 175° C. or higher. Here, the TSD portion 103 resumes the circuit operation when the junction temperature of the LED driver IC 100 becomes 150° C. or lower.

The OVP portion 104 detects an output voltage Vout from a DC/DC by means of an OVP terminal voltage and performs overvoltage protection when the OVP terminal voltage becomes 2.0 V or higher. When the overvoltage protection is performed, an SS terminal capacitor C7 is discharged and DC/DC switching is turned off.

The control logic portion 105 includes: a function to output a trouble detection signal from the FAIL1 terminal by monitoring a detection state of the various protection circuit portion; and a function to apply timer latching to a PWM signal.

The OCP portion 106 detects an electric current flowing in a power FET (transistor N1) as a voltage signal by means of a high-side detection resistor R8 and performs overcurrent protection when a CS terminal voltage becomes VCC−0.6 V or lower. When the overcurrent protection is performed, the SS terminal capacitor C7 is discharged and the DC/DC switching is turned off.

The comparator 107 compares the CS terminal voltage applied to an inverting input terminal (−) and a predetermined reference voltage (VCC−V1) input to a non-inverting input terminal (+) with each other and outputs the comparison result to the OCP portion 106.

The Schmitt trigger 108 transmits an input signal for the SYNC terminal to the oscillation portion 109.

The oscillation portion 109 generates a predetermined clock signal in accordance with the input signal for the SYNC terminal or a terminal voltage of the RT terminal and outputs this clock signal to the slope generation portion 110.

The slope generation portion 110 generates a slope signal (triangular wave signal) based on the clock signal input from the oscillation portion 109 and outputs the slope signal to the PWM comparator 111. Besides, the slope generation portion 110 has also a function to give an offset to the slope signal in accordance with the CS terminal voltage (which corresponds to a switching current flowing in the transistor N1).

The PWM comparator 111 compares an error signal input to a non-inverting input terminal (+) and the slope signal input to an inverting input terminal (−) with each other to generate an internal PWM signal and outputs this PWM signal to the driver control portion 112.

The driver control portion 112, based on the internal PWM signal, generates drive signals for the high-side driver 113, the transistor 114, and the low-side driver 115.

The upside driver 113, based on the drive signal input from the driver control portion 112, applies pulse driving to an OUTH terminal voltage (gate voltage of the transistor N1) between a BOOT terminal voltage and an SW terminal voltage.

The transistor 114 is turned on/off based on the drive signal input from the driver control portion 112.

The low-side driver 115, based on the drive signal input from the driver control portion 112, applies pulse driving to an OUTL terminal voltage (gate voltage of the transistor N2) between a VREG terminal voltage and an ground voltage.

The error amp 116 amplifies a difference between the lower of a THM terminal voltage and a reference voltage and an FB terminal voltage to generate an error signal, and outputs the error signal to the PWM comparator 111.

The soft start portion 117 controls the error amp 116 to slowly increase a voltage level of the error signal in accordance with an SS terminal voltage.

The LED short-circuit detection portion 118 monitors an LEDR terminal voltage and an LEDC terminal voltage to detect whether any one of light emitting diodes LED1 to LEDn is shorted or not.

The CR timer portion 119 uses a DISC terminal and a VTH terminal to perform PWM light adjustment control of the line LED of light emitting diodes.

The various trouble detection portion 120 has a function to monitor not only detection states of an LED open detection circuit (OPEN) and an LED anode/cathode ground short-circuit detection circuit (SCP) but also a detection state of the LED short-circuit detection portion 118, perform various protection operations, and output a trouble detection signal from the FAIL2 terminal.

The comparator 121 compares the FB terminal voltage input to a non-inverting input terminal (+) and a predetermined reference voltage (V2) input to an inverting input terminal (−) with each other, and outputs the comparison result to the various trouble detection portion 120.

The comparator 122 compares the FB terminal voltage input to a non-inverting input terminal (+) and a predetermined reference voltage (V3) input to an inverting input terminal (−) with each other, and outputs the comparison result to the various trouble detection portion 120.

<Voltage Step-Up/Down Application Structure>

Besides, in a voltage step-up/down application structure in FIG. 1, there connected to outside of the LED driver IC 100 are: N channel MOS field effect transistors N1 to N3; resistors R1 to R15; capacitors C1 to C9; Zener diodes D1 and D2; an inductor L1; and light emitting diodes LED1 to LEDn (hereinafter, the light emitting diodes LED1 to LEDn connected in series are sometimes called collectively a line LED of light emitting diodes).

A drain of the transistor N1 is connected to an application terminal for the input voltage Vin via the resistor R8 and also connected to the CS terminal via the resistor R9. A source and a back gate of the transistor N1 are connected to the SW terminal. A gate of the transistor N1 is connected to the OUTH terminal. A cathode of the Zener diode D1 is connected to the SW terminal. An anode of the Zener diode D1 is connected to the ground terminal. A first terminal of the inductor L1 is connected to the SW terminal. A second terminal of the inductor L1 is connected to an anode of the Zener diode D2 and a drain of the transistor N2. A source and a back gate of the transistor N2 are connected to the ground terminal. A gate of the transistor N2 is connected to the OUTL terminal. A cathode of the Zener diode D2 is connected to an anode of the light emitting diode LED1 and also connected to the ground terminal via the resistors R6 and R7 that are connected in series. A connection node between the resistor R6 and the resistor R7 is connected to the OVP terminal. A cathode of the light emitting diode LEDn is connected to a drain of the transistor N3. A source and a back gate of the transistor N3 are connected to the FB terminal and also connected to the ground terminal via the resistor R5. A gate of the transistor N3 is connected to the PWMOUT terminal. A first terminal of the resistor R1 is connected to an anode of the light emitting diode LEDn. A second terminal of the resistor R1 is connected to a first terminal of the resistor R2 and also connected to the LEDC terminal. A second terminal of the resistor R2 is connected to the cathode of the light emitting diode LEDn. A first terminal of the resistor R3 is connected to the anode of the light emitting diode LED1. A second terminal of the resistor R3 is connected to a first terminal of the resistor R4 and also connected to the LEDR terminal. A second terminal of the resistor R4 is connected to the cathode of the light emitting diode LEDn.

The capacitor C1 is connected across the application terminal for the input voltage Vin and the ground terminal. The capacitor C2 is connected between the VREG terminal and the ground terminal. The capacitor C3 is connected between the anode of the light emitting diode LED1 and the ground terminal. The capacitor C4 is connected between the application terminal for the input voltage Vin and the CS terminal. The capacitor C5 is connected across the BOOT terminal and the SW terminal. The GND terminal is connected to the ground terminal. The VCC terminal is connected to the application terminal for the input voltage Vin. The RT terminal is connected to the ground terminal via the resistor R10. The COMP terminal is connected to the ground terminal via the resistor R11 and the capacitor C6 that are connected in series. The SS terminal is connected to the ground terminal via the capacitor C7. The resistors R12 and R13 are connected in series between an application terminal for the internal reference voltage VREG and the ground terminal. A connection node between the resistor R12 and the resistor R13 is connected to the THM terminal. Here, the resistor R13 is a thermistor that has a negative temperature characteristic. The resistors R14, R15 and the capacitor C8 are connected in series between the application terminal for the internal reference voltage VREG and the ground terminal. A connection node between the resistor R14 and the resistor R15 is connected to the DISC terminal. A connection node between the resistor R15 and the capacitor C8 is connected to the VTH terminal. The PGND terminal is connected to the ground terminal. The CT terminal is connected to the ground terminal via the capacitor C9.

<Terminal Description>

Figure 2:
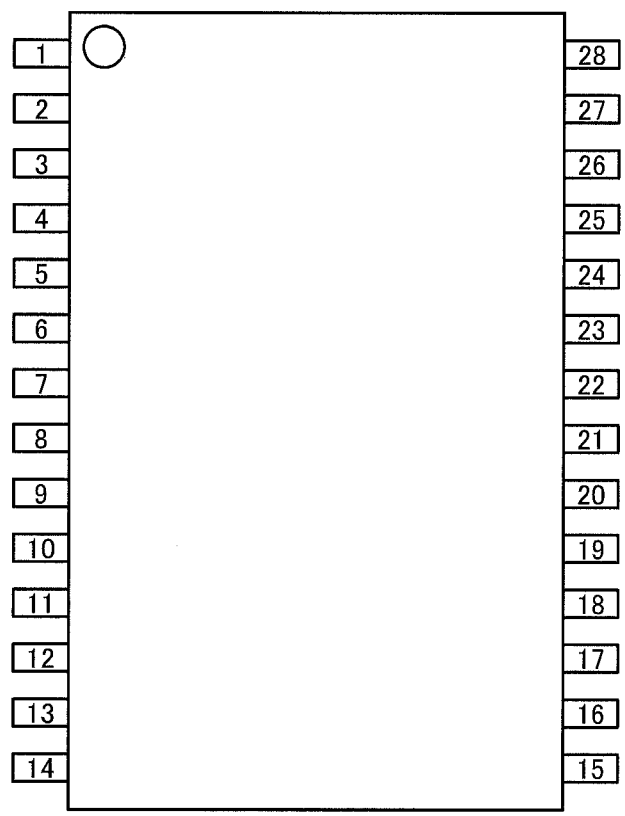
FIG. 2 is a pin arrangement diagram of a LED driver IC 100.

FIG. 2 is a pin arrangement diagram of the LED driver IC 100, and FIG. 3 is a terminal list of the LED driver IC 100. The COMP terminal (1st pin) is an error amp output terminal. The SS terminal (2nd pin) is a soft start terminal. The VCC terminal (3rd pin) is an input power-source terminal. The EN terminal (4th pin) is an enable terminal. The RT terminal (5th pin) is an oscillation frequency setting resistor connection terminal. The SYNC terminal (6th pin) is an external synchronization signal input terminal. The GND terminal (7th pin) is a small signal portion GND terminal. The THM terminal (8th pin) is a thermistor connection terminal. The FB terminal (9th pin) is an error amp FB signal input terminal. The DISC terminal (10th pin) is a CR timer discharge terminal. The VTH terminal (11th pin) is a CR timer threshold terminal. The DRLIN terminal (12th pin) is a DRL [Daytime Running Lamps] changeover terminal (pulse output setting terminal). The FAIL1 terminal (13th pin) is an output terminal at a trouble time. The FAIL2 terminal (14th pin) is an LED open/short-circuit trouble output terminal. The OVP terminal (15th pin) is an over voltage detection terminal. The LEDC terminal (16th pin) is an LED short-circuit detection terminal (LED detection side). The LEDR terminal (17th pin) is an LED short-circuit detection terminal (resistor detection side). The N.C. terminal (18th pin) is a non-connection terminal (unused terminal). The PGND terminal (19th pin) is a PWM light adjustment driver source terminal. The PWMOUT terminal (20th pin) is a PWM light adjustment signal output terminal. The CT terminal (21st pin) is a ground short-circuit protection timer time setting terminal. The OUTL terminal (22nd pin) is a low-side external FET gate drive terminal. The DGND terminal (23rd pin) is a low-side FET driver source terminal. The SW terminal (24th pin) is a high-side FET source terminal. The OUTH terminal (25th pin) is a high-side external FET gate drive terminal. The CS terminal (26th pin) is a DC/DC output current detection terminal. The BOOT terminal (27th pin) is a high-side FET driver power-source terminal. The VREG terminal (28th pin) is an internal constant voltage output terminal.

<Overview>

The LED driver IC 100 is a vehicle lamp white LED driver (switching regulator type) that is resistant to a high voltage of 50V. The LED driver IC 100 incorporates a DC/DC controller compatible with a voltage step-up/down current mode and is able to achieve a stable operation with no limit to the number of LED stages even in a case where an unstable change occurs in a power-source voltage (at a time of direct connection to a battery and the like). The LED driver IC 100 is able to select either of a PWM method and a linear method as an LED light adjustment method. The LED driver IC 100 incorporates a PWM light adjustment signal generation circuit and is able to perform control without using a microcomputer.

<Features>

A first feature of the LED driver IC 100 is that an input voltage range of 5.0V to 30V is achieved. A second feature is that the DC/DC controller compatible with the voltage step-up/down current mode is incorporated. A third feature is that a PWM light adjustment CR timer is incorporated. A fourth feature is that the LED driver IC 100 is compatible with PWM linear light adjustment. A fifth feature is that various protection functions (UVLO, OVP, TSD, OCP, SCP [Short circuit Protecion]) are incorporated. A sixth feature is that an LED trouble state detection function is incorporated (LED open/LED short-circuit detection function). A seventh feature is that an HTSSOP [Heat-sink Thin-Shrink Small Outline Package]—B28 package is employed.

<Applications>

Figure 22A:
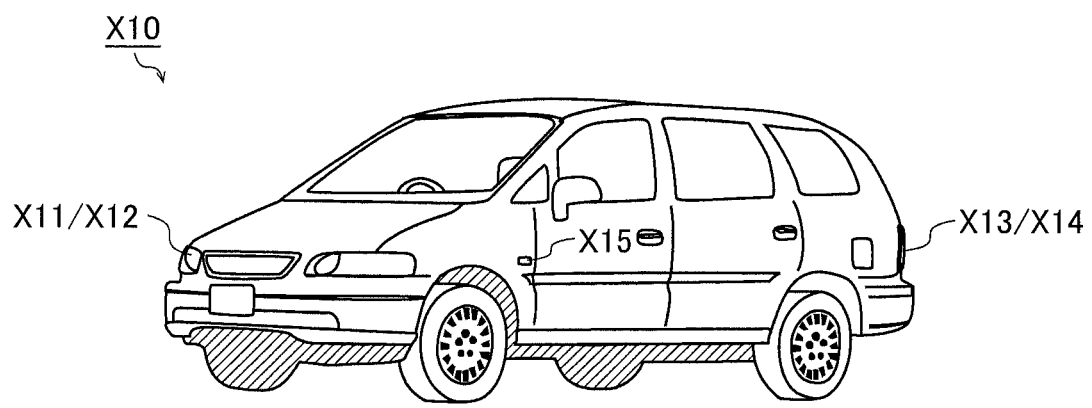
FIG. 22A is an appearance view (front side) of a vehicle in which the LED driver IC 100 is mounted.
Figure 22B:
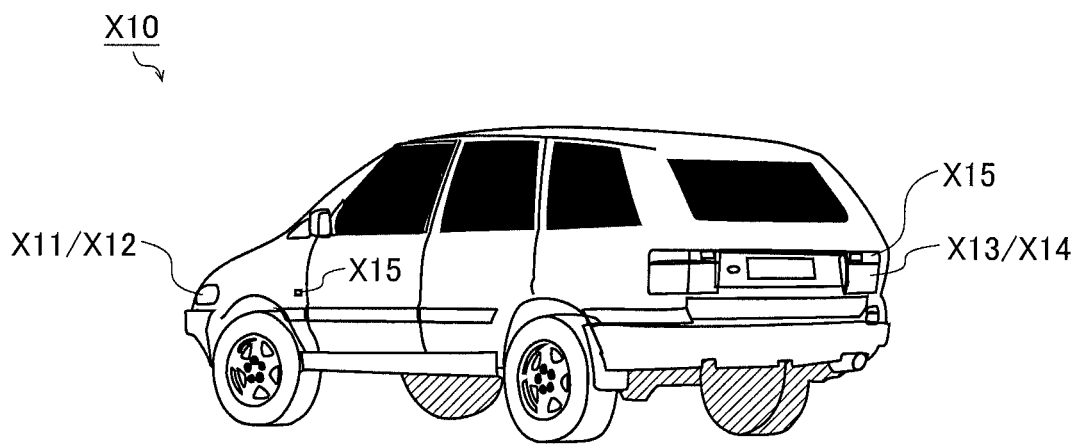
FIG. 22B is an appearance view (rear side) of a vehicle in which the LED driver IC 100 is mounted.
Figure 23A:
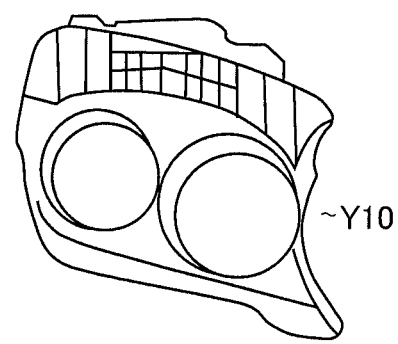
FIG. 23A is an appearance view of an LED head light module.
Figure 23B:
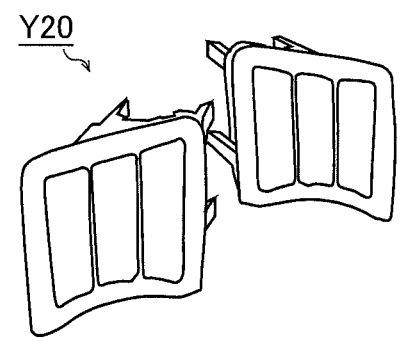
FIG. 23B is an appearance view of an LED turn signal lamp module.
Figure 23C:
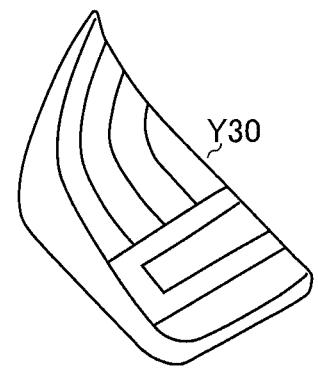
FIG. 23C is an appearance view of an LED rear lamp module.
Figure 24:
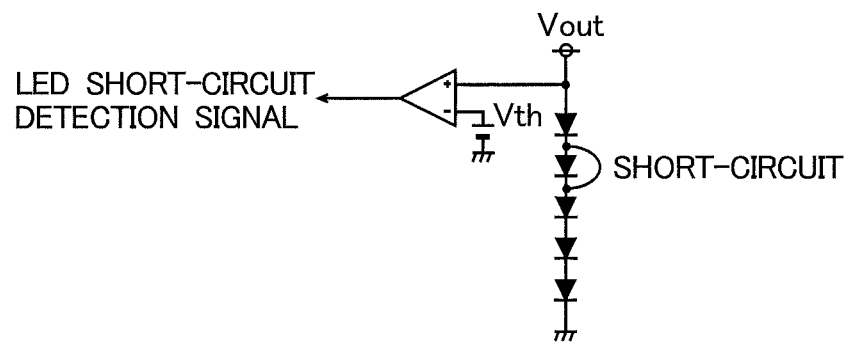
FIG. 24 is a circuit diagram showing a conventional example of an LED short-circuit detection circuit.

The LED driver IC 100 is, as shown in FIG. 22A and FIG. 22B, for example, preferably usable as a drive means in a vehicle X10 for a head light (suitably inclusive of a high beam/low beam/a small lamp/a fog lamp and the like) X11; a daytime and night running (DRL) light source X12; a tail lamp (suitably inclusive of a small lamp, a back lamp and the like) X13; a stop lamp X14; a turn signal lamp X15 and the like. Here, the LED driver IC 100 may be provided as an LED lamp module (an LED head light module Y10 in FIG. 23A, an LED turn signal lamp module Y20 in FIG. 23B, an LED rear lamp module Y30 in FIG. 23C and the like) together with an LED that is a drive target; or may be provided as a discrete IC independent of the LED.

<5 V Constant Voltage (VREG)>

The LED driver IC 100 has the internal constant voltage generation portion 101 (at EN=Hi) that generates the internal constant voltage VREG of 5 V from the input voltage Vin input to the VCC terminal. This internal constant voltage VREG is used as a power source for internal circuits that are included in the LED driver IC 100 and also used when a terminal is fixed at a high level voltage outside the LED driver IC 100. The internal constant voltage VREG is monitored by the UVLO portion 102. When the internal constant voltage VREG becomes 4.5 V or higher, the internal circuit starts to operate, while when the internal constant voltage VREG becomes 4.3 V or lower, the internal circuit stops the operation. It is desirable to connect a phase compensation capacitor C2 (e.g., 10 μF) to the VREG terminal to stabilize the circuit operation.

<Output Current Setting Method>

An output current ILED flowing to the line LED of light emitting diodes is expressed by the following formula (1). Here, in the following formula (1), as min [THM/5V, 0.2 V], the smaller of the THM terminal voltage and VFB=0.2 V is selected.

$$ILED=min[THM/5\ V, 0.2\ V]/RISET[A] \quad (1)$$

In a case where the THM terminal is used to control the output current ILED, to avoid an erroneous operation of the LED ground short-circuit detection function, it is desirable to perform the input in a range of 0.25 V to 5 V as an input range. Here, linear control is performed from THM=1.0 V. In a case where the THM terminal is not used, it is desirable to connect the THM terminal to the VREG terminal.

<PWM Light Adjustment Control>

Figure 4:
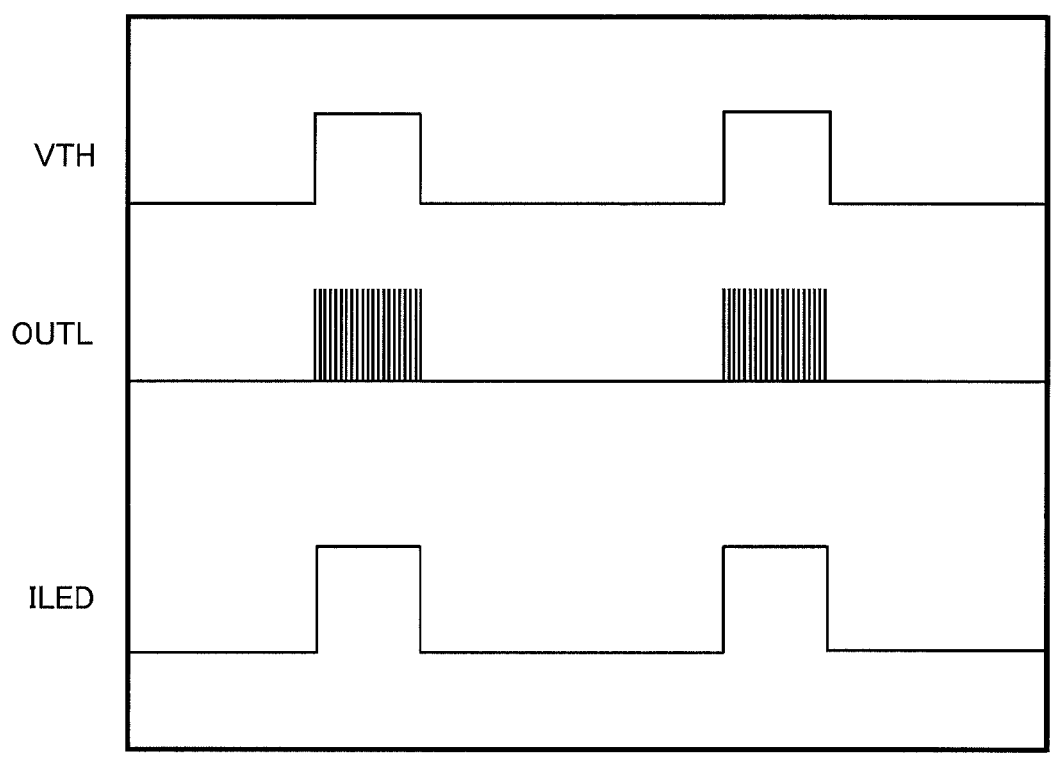
FIG. 4 is a time chart showing behavior of VTH, OUTL, and ILED.

As for PWM light adjustment control, it is possible to perform either of light adjustment control by means of the PWM signal from outside and light adjustment control by means of the CR timer portion 119. FIG. 4 is a time chart showing behavior of the VTH, the OUTL, and the ILED. A drive frequency FPWM and an on time TON_PWM for the PWM light adjustment control are each calculable by means of the following formulas (2) and (3). Here, parameters RCR1, RCR2 and CCR in the formulas (2) and (3) indicate resistor values of the resistors R14, R15 and a capacitance value of the capacitor C8 shown in FIG. 1, respectively. As an example of each value, a setting may be employed, in which RCR1=20 kΩ, RCR2=10 kΩ, and CCR=100000 pF.

$$FPWM=1.44/\{(RCR1+2RCR2)\times CCR\} \quad (2)$$

$$TON\_PWM=\{RCR2/(RCR1+2RCR2)\}\times 100 \quad (3)$$

<Time from EN Turning-On to PWM Turning-On and Start from PWM Low Duty>

Figure 5:
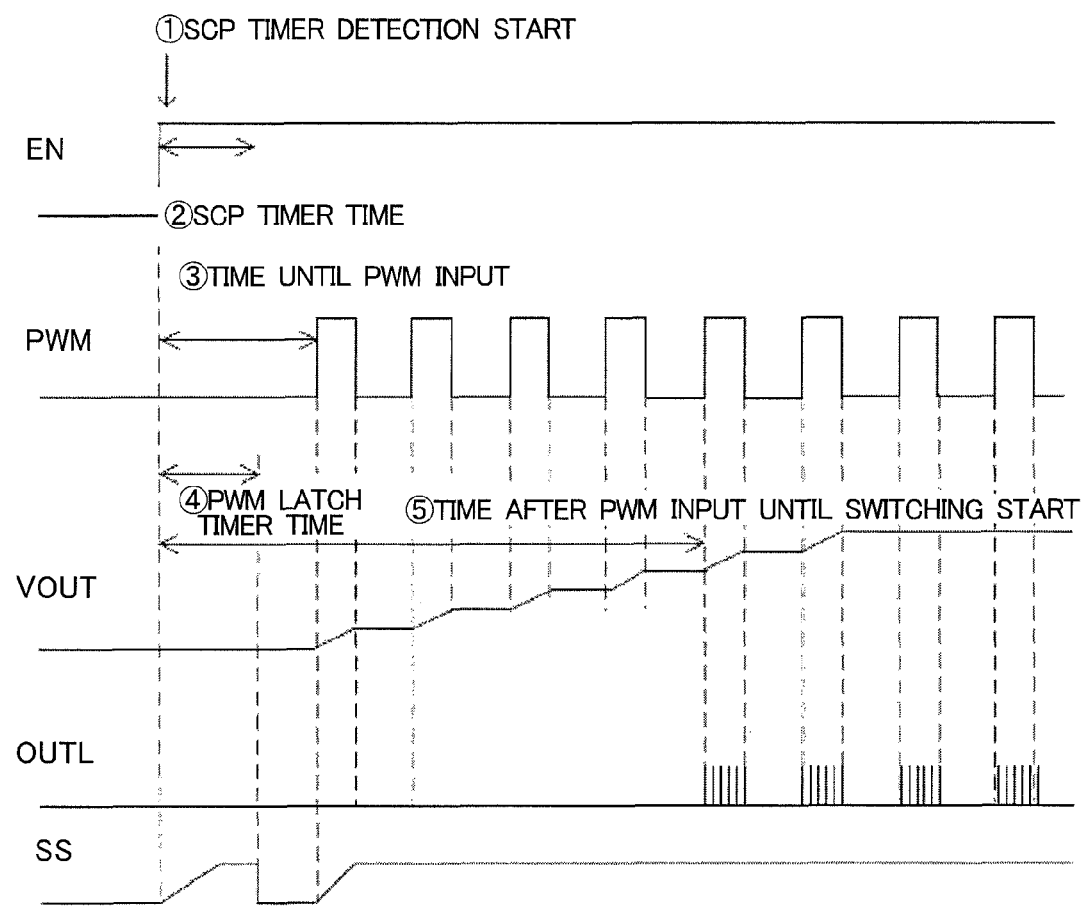

FIG. 5 is a time chart for describing a PWM start sequence after EN turning-on. In a case where the light adjustment control by means of the PWM signal from outside is performed, to avoid an erroneous operation of the ground short-circuit protection detection function (SCP) that starts to operate simultaneously with the input of an enable signal EN, it is desirable to set a time from the input of the enable signal EN to the input of the PWM signal at a time that is shorter than a ground short-circuit protection detection timer time.

The ground short-circuit protection detection function (SCP) starts at a change time of EN=Low→Hi and turns off the latching after an elapse of an SCP timer time set by means of the external capacitor C9 that is connected to the CT terminal (see circled numbers 1 and 2 in FIG. 5). Besides, charging of the capacitor C6 connected to the SS terminal is started in synchronization with the EN input. In a case where the PWM signal is not input within the PWM latch timer time, the PWM signal is latched off (see circled numbers 3 and 4 in FIG. 5). At the PWM latch-off detection time, the capacitor C6 connected to the SS terminal is discharged and the counter of the SCP timer is reset. Here, the PWM latch timer time is calculated by the oscillation frequency of the DC/DC×32770 counts. Accordingly, in the case where the light adjustment control by means of the PWM signal from outside is performed, there is a relationship shown below among the time from the EN input to the PWM input, the PWM latch timer time, and the SCP timer time:

(2)<(4)<(3)→SCP detected and LED not turned on (4)<(2)<(3)→LED turned on (4)<(3)<(2)→LED turned on (Because (4) does not operate after the turning-on of (3), (3)<(4) is removed from the sequence).

<PWM Control Changeover Function>

The LED driver IC 100 is able to change a daytime mode (operation mode to supply a DC current to the LED) and a night mode (operation mode to supply a pulse-like current to the LED) by using the DRLIN terminal. Here, in the daytime mode, the DC current is supplied to the LED, so that it is also possible to use the LED driver IC 100 to drive the low beam. Besides, in the night mode, the pulse-like current is supplied to the LED, so that it is also possible to use the LED driver IC 100 to drive the turn signal lamp. As described above, the LED driver IC 100 is able to deal with various light units by means of one IC.

<LED Current Derating Using THM Terminal>

Figure 19:
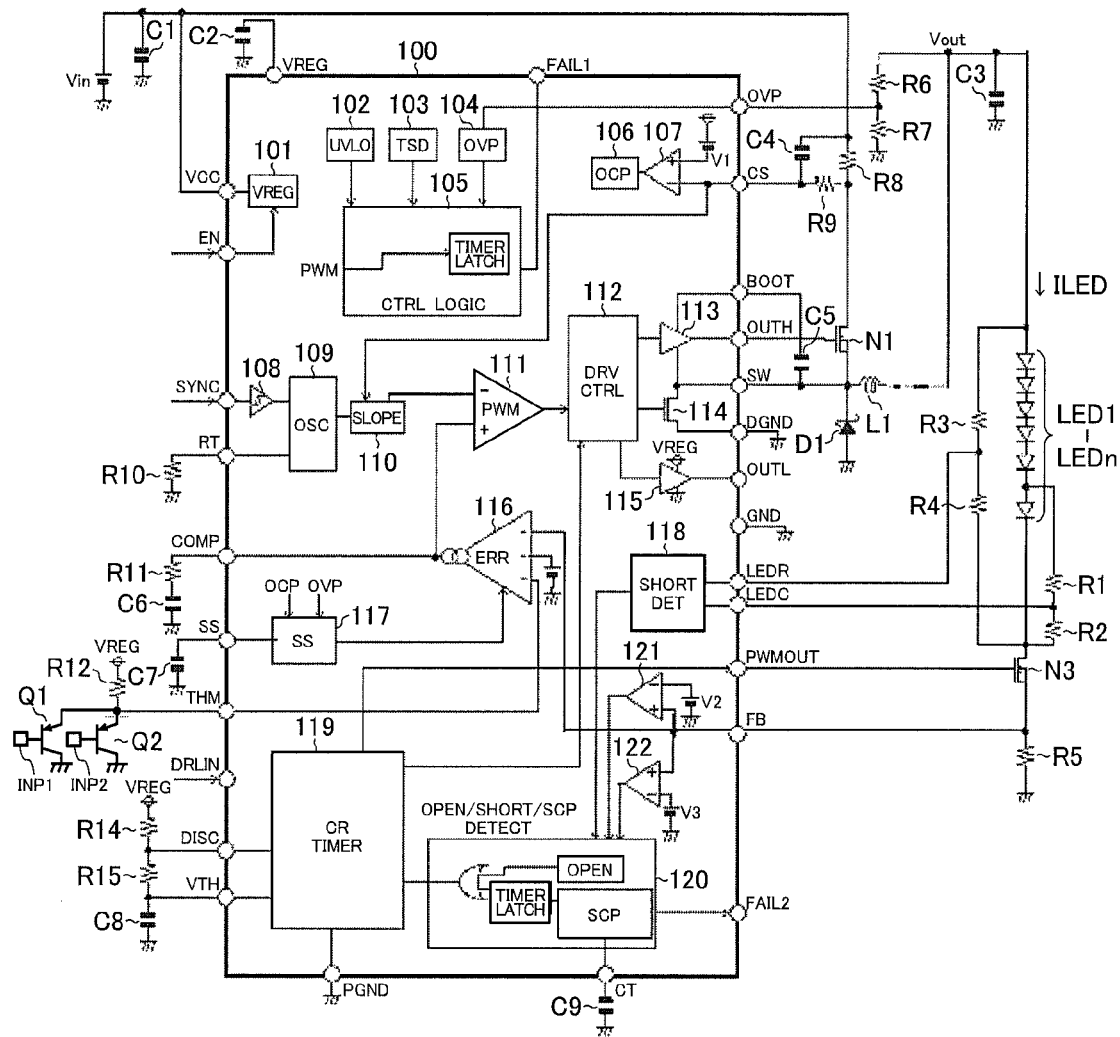
FIG. 19 is a circuit block diagram showing a second structural example (voltage step-down application structural example) of the LED driver IC 100.

The LED driver IC 100 has, as one of functions that use the THM terminal, a capability to set a derating curve of the LED current versus temperature. The LED is fast in deterioration during a high temperature time, so that a curve of the maximum allowable LED current versus temperature is given to a data sheet of the LED. Accordingly, the LED driver IC 100 is able to use the thermistor resistor R13 to input a voltage, which has a negative temperature characteristic, to the THM terminal, thereby controlling the LED current in accordance with an ambient temperature. Besides, the LED driver IC 100, as shown in FIG. 19, is able to use two external transistors Q1 and Q2 instead of the thermistor resistor R13 to employ a two-input selector structure (INP1, INP2).

<Overvoltage Protection Circuit OVP>

A divided voltage of an output voltage Vout, which is drawn from the connection node between the resistor R6 and the resistor R7, is input to the OVP terminal. An OVP set voltage may be decided based on the series number n of the line LED of light emitting diodes and unevenness of the forward drop voltage VF. When deciding the OVP set voltage, it is desirable to decide considering OVP×0.85 as well that is an open detection trigger. After the OVP starts to operate, when the output voltage Vout drops to 72.5% of the OVP set voltage, the OVP is released. When a resistance value of the resistor R6 is ROVP1 and a resistance value of the resistor R7 is ROVP2, the following formula (4) is satisfied. Accordingly, for example, when a setting is employed in which ROVP1=330 kΩ and ROVP2=22 kΩ, the OVP is performed when the Vout becomes 32 V or higher.

$$Vout \geq \{(ROVP1+ROVP2)/ROVP2\} \times 2.0 \text{ V} \quad (4)$$

<Oscillation Frequency FOSC of Voltage Step-Up/Down DC/DC Converter>

Figure 6:
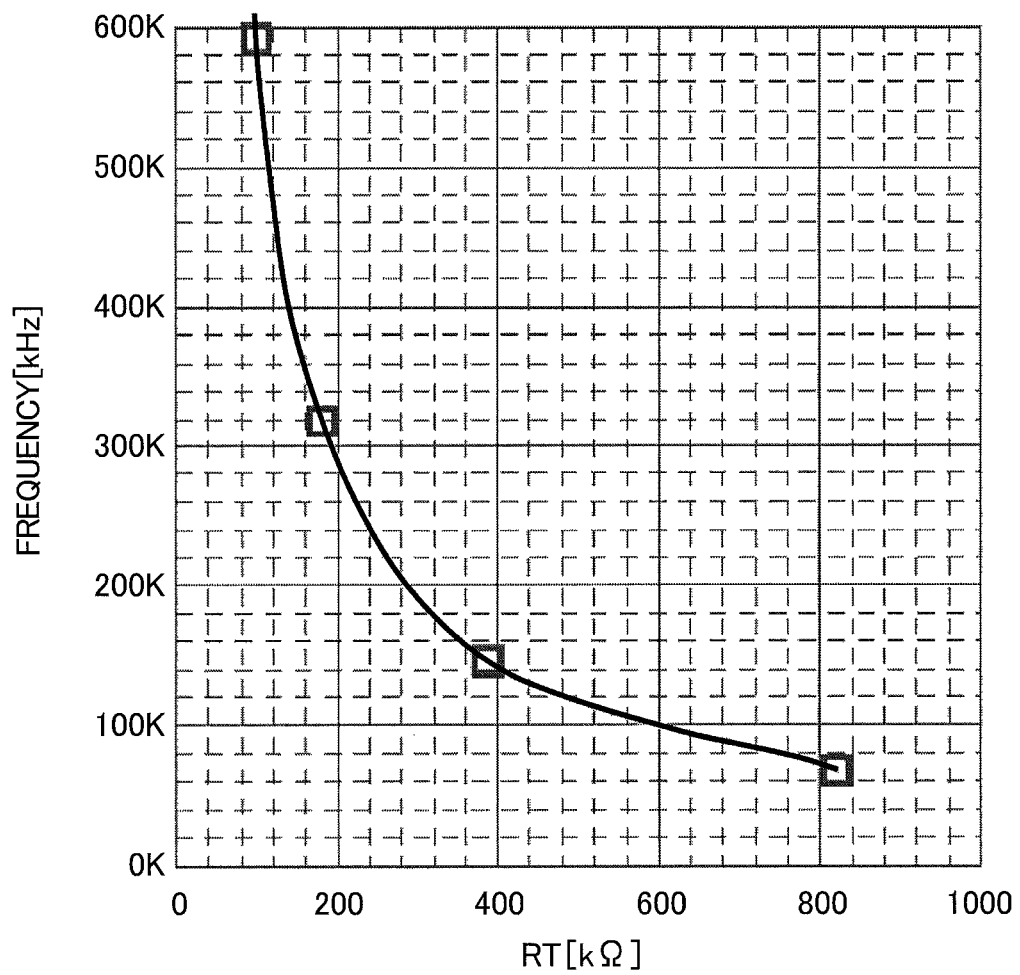
FIG. 6 is a correlation graph between RT versus a switching frequency.

By adjusting a resistance value of the resistor R10 connected to the RT terminal, it is possible to decide a charge-discharge current for an internal capacitor and set a triangular wave oscillation frequency (and an oscillation frequency FOSC of the voltage step-up/down DC/DC converter). It is desirable to set the resistance value (RT) of the resistor R10 in view of the following theoretical formula (5). $60 \times 10^6$ [V/A/S] in the formula (5) is a constant decided in an inside of the circuit and α is a correction coefficient (RT:α=50 kΩ:0.98, 60 kΩ:0.985, 70 kΩ:0.99, 80 kΩ:0.994, 90 kΩ:0.996, 100 kΩ:1.0, 150 kΩ:1.01, 200 kΩ:1.02, 300 kΩ:1.03, 400 kΩ:1.04, 500 kΩ:1.045). Besides, in a setting outside a frequency range in FIG. 6, there is a risk that the switching is stopped, so that it is desirable to set the resistance value RT in a range of 62.6 kΩ to 523 kΩ.

$$FOSC=(60 \times 10^6/RT[\Omega]) \times \alpha [kHz] \quad (5)$$

<External Synchronization Oscillation Frequency FSYNC>

The LED driver IC 100 has the SYNC terminal that receives a clock input for synchronizing the voltage step-up/down DC/DC converter with outside. However, when performing the clock input to the SYNC terminal, operation such as changing to an internal oscillation and the like should not be performed during the clock input. There is a delay time of about 30 μsec. after the SYNC terminal is changed from a high level to a fixed low level until the oscillation portion 109 starts to operate. The clock input to the SYNC terminal is valid at a rising edge only. When performing the clock input to the SYNC terminal, an external oscillation frequency set by using the SYNC terminal is prioritized. Because of this, in a case where an internal oscillation frequency set by using the RT terminal is low and the external oscillation frequency set by using the SYNC terminal is high, there is a risk that an erroneous oscillation occurs during a reduced voltage time, so that it is desirable to set the resistance value of the resistor R10 connected to the RT terminal at 100 kΩ in the case where the external oscillation frequency is used.

<Soft Start SS>

In the LED driver IC 100, the output voltage Vout rises slowly with a start time current being limited, so that it is possible to prevent an overshoot of the output voltage Vout and a rush current. Besides, at an OCP detection time and an OVP detection time, the SS terminal voltage is reset to a low level, so that the switching is stopped and a resumption operation is started.

<Self-Diagnosis Function>

Figure 7:
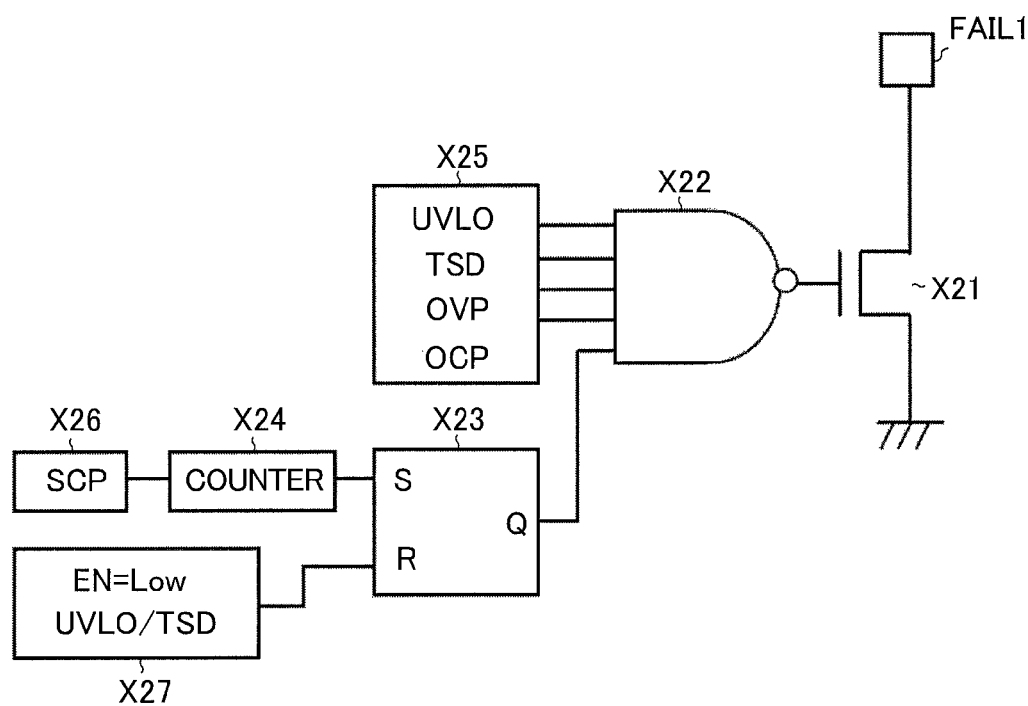
FIG. 7 is a block diagram for describing a FAIL1 output function.
Figure 8:
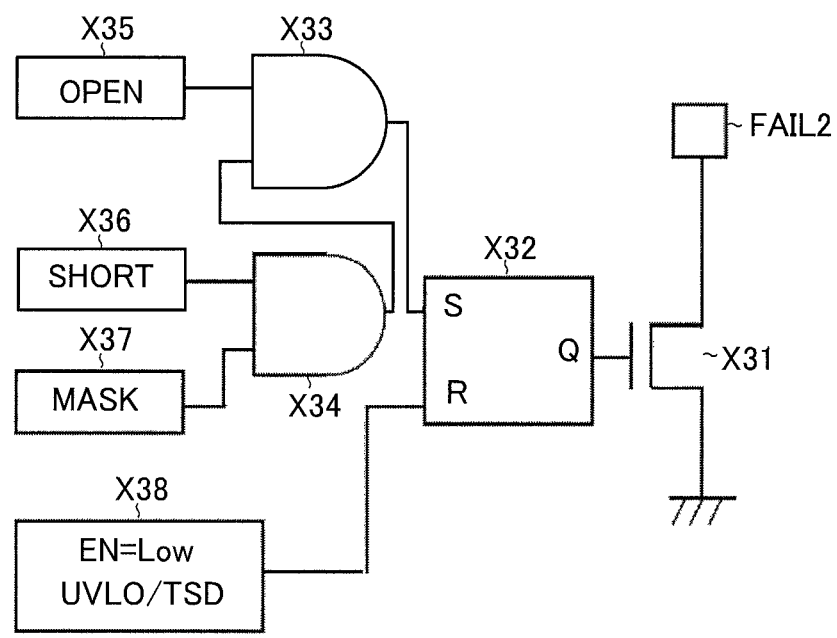
FIG. 8 is a block diagram showing for describing a FAIL2 output function.

FIG. 7 is a block diagram for describing a FAIL1 output function, and FIG. 8 is a block diagram for describing a FAIL2 output function.

As shown in FIG. 7, as means for achieving the FAIL1 output function, there are: an N channel MOS field effect transistor X21; a NAND gate X22; an SR flip-flop X23; and a counter X24. A drain of the transistor X21 is connected to the FAIL1 terminal. A source of the transistor X21 is connected to the ground terminal. A gate of the transistor X21 is connected to an output terminal of the NAND gate X22. Five input terminals disposed on the NAND gate X22 are connected to an application terminal X25 (application terminal for a UVLO signal, a TSD signal, an OVP signal, and an OCP signal) for various signals and to an output terminal (Q) of the SR flip-flop X23. A set terminal (S) of the SR flip-flop X23 is connected to an output terminal of the counter X24. An input terminal of the counter X24 is connected to an application terminal X26 for the SCP signal. A reset terminal (R) of the SR flip-flop X23 is connected to an application terminal X27 (application terminal for the EN signal, the UVLO signal, and the TSD signal) for various signals.

As shown in FIG. 8, as means for achieving the FAIL2 output function, there are: an N channel MOS field effect transistor X31; an SR flip-flop X32; AND gates X33 and X34. A drain of the transistor X31 is connected to the FAIL2 terminal. A source of the transistor X31 is connected to the ground terminal. A gate of the transistor X31 is connected to an output terminal (Q) of the SR flip-flop X32. A set terminal (S) of the SR flip-flop X32 is connected to an output terminal of the AND gate X33. A reset terminal (R) of the SR flip-flop X32 is connected to an application terminal X38 (application terminal for the EN signal, the UVLO signal, and the TSD signal) for various signals. A first input terminal of the AND gate X33 is connected to an application terminal X35 for an OPEN signal. A second input terminal of the AND gate X33 is connected to an output terminal of the AND gate X34. A first input terminal of the AND gate X34 is connected to an application terminal X36 for a SHORT signal. A second input terminal of the AND gate X34 is connected to an application terminal X37 for a MASK signal.

The LED driver IC 100 outputs an operation state of the protection circuit incorporated in the IC to the FAIL1 terminal and the FAIL2 terminal (both are open drain type). The output signal from the FAIL1 terminal goes to a low level when any one of the UVLO, the TSD, the OVP, and the SCP operates. The output signal from the FAIL2 terminal goes to a low level when either of the LED open detection and the LED short-circuit detection operates.

<Protection Circuit Operation>

A low voltage erroneous operation prevention circuit (UVLO portion 102) shuts down the circuits other than the internal constant voltage generation portion 101 when the internal constant voltage VREG becomes 4.3 V or lower. A temperature protection circuit (TSD portion 103) shuts down the circuits other than the internal constant voltage generation portion 101 when the junction temperature of the IC becomes 175° C. or higher. Here, the TSD portion 103 resumes the circuit operation when the junction temperature of the IC becomes 150° C. or lower. An overcurrent protection circuit (OCP portion 106) detects the current flowing in the power FET (transistor N1) as a voltage signal by means of the high-side detection resistor R8, and performs overcurrent protection when the CS terminal voltage becomes VCC−0.6

V or lower. When the overcurrent protection is performed, the SS terminal capacitor C7 is discharged and the DC/DC switching is turned off. An overvoltage protection circuit (OVP portion 104) detects the output voltage Vout from the DC/DC by means of the OVP terminal voltage and performs overvoltage protection when the OVP terminal voltage becomes 2.0 V or higher. When the overvoltage protection is performed, the SS terminal capacitor C7 is discharged and the DC/DC switching is turned off.

<Output Short-Circuit Protection Circuit (SCP)>

In an output short-circuit protection circuit (SCP) of the various trouble detection portion 120, when the FB terminal voltage becomes 50 mV or lower, operation of the incorporated counter is started; and after an elapse of about 150 ms (at CT: 0.1 µF), the latching is performed and the circuit is shut down. When the FB terminal voltage becomes 50 mV or higher within 50 ms, the counter is reset. When the anode side (DC/DC output side) of the line LED of light emitting diodes shorts to the ground, the FB terminal voltage goes to a low level. Besides, also in a case where the cathode side of the line LED of light emitting diodes shorts to the ground, the FB terminal voltage goes to the low level. Accordingly, the output short-circuit protection circuit (SCP) deals with the ground short-circuit protection of both the anode/cathode of the line LED of light emitting diodes.

<LED Open Detection Circuit (OPEN)>

In the LED open detection circuit (OPEN) of the various trouble detection portion 120, when the FB terminal voltage is 50 mV or lower and the OVP terminal voltage is 1.7 V or higher, the LED open detection is performed and the DC/DC operation is stopped.

<LED Short-Circuit Detection Portion>

In the LED short-circuit detection portion 118, to detect a case where any one of a plurality of light emitting diodes incorporated in a high brightness LED shorts, when a condition LEDR−LEDC≥0.2, or a condition LEDC−LEDR≥0.2 V is met, the operation of the incorporated counter is started; and after an elapse of about 100 ms (at FOSC=300 kHz), the circuit is latched off. During the PWM light adjustment time, the LED short-circuit detection signal is masked in such a way that the LED short-circuit detection operation becomes valid only when the PWM signal is in a high level (see the AND gate X34 in FIG. 8); after an elapse of about 100 ms (at FOSC=300 kHZ) after the detection, the circuit is latched off. When the LED short-circuit detection condition is released within 100 ms, the counter is reset. However, in a case where a width of the PWM pulse is 20 µs or smaller, the LED short-circuit detection is not performed. Besides, in a case where there is a large unevenness in the forward drop voltage VF of the connected light emitting diode, there is a risk that the LED short-circuit detection operates erroneously. Accordingly, it is desirable to suitably adjust the resistors R1 to R4 considering the forward drop voltage VF of the connected light emitting diode. Besides, an input range of 2 V to 3 V for the LEDR terminal and the LEDC terminal is desirable. The frequency of the counter is a frequency decided by means of the RT terminal and the latching is performed at 32770 counts.

Figure 9:
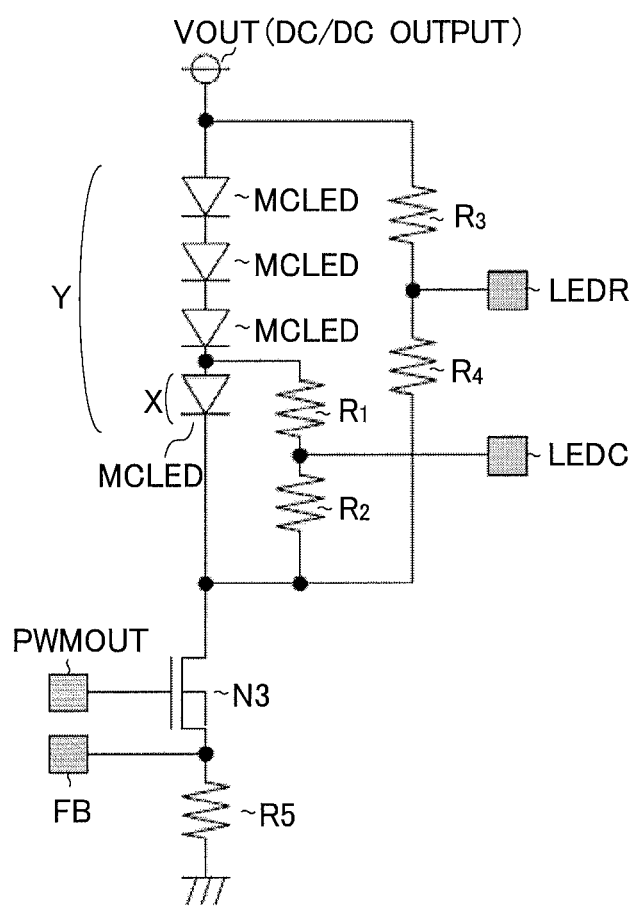
FIG. 9 is a circuit diagram (a multi-chip is used) for describing an LED short-circuit detection function.

FIG. 9 is a circuit diagram (multi-chips are used) for describing the LED short-circuit detection function. In a case where a total of Y high brightness light emitting diodes (multi-chips) MCLED each of which incorporates a total of X light emitting diodes in one chip are used, a setting may be employed, in which R1:R2=X:1, R3:R4=(X+1)×Y−1:1.

Figure 10:
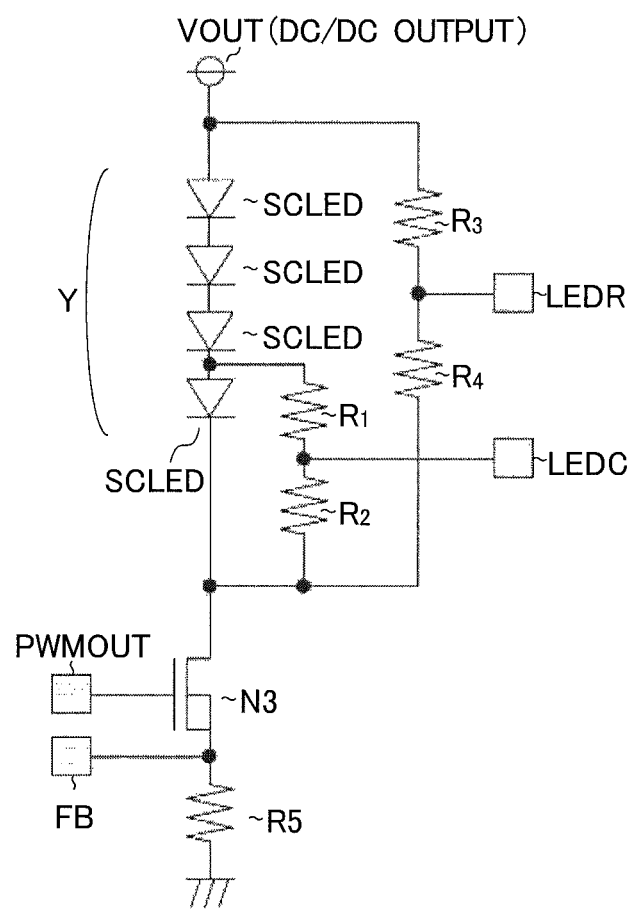
FIG. 10 is a circuit diagram (a single chip is used) for describing an LED short-circuit detection function.

FIG. 10 is a circuit diagram (single chips are used) for describing the LED short-circuit detection function. In a case where a total of Y light emitting diodes (shingle chips) SCLED each of which incorporates one light emitting diode in one chip are used, a setting may be employed, in which R1:R2=1:1, R3:R4=2×Y−1:1.

<All Trouble Conditions>

FIG. 11 is a protection function list of the LED driver IC 100. A UVLO detection condition is VREG<4.3 V and a UVLO release condition is VREG>4.5 V. Operation during a UVLO detection time is a shutdown of all the blocks (other than the REG). A TSD detection condition is Tj>175° C. and a TSD release condition is Tj<150° C. Operation during a TSD detection time is a shutdown of all the blocks (other than the REG). An OVP detection condition is VOVP>2.0 V and an OVP release condition is VOVP<1.45 V. Operation during an OVP detection time is drawing of electric charges from the SS terminal (discharge). An OCP detection condition is VCS VCC≤0.6 V and an OCP release condition is VCS>VCC−0.6 V. Operation during an OCP detection time is drawing of electric charges from the SS terminal (discharge). An SCP detection condition is VFB<0.05 V (at 150 ms delay, CT=0.1 µF) and an SCP release condition is an EN input or a UVLO release. Operation during an SCP detection time is latching-off (other than the REG) after a predetermined time counted by a delay counter. An LED open protection detection condition is VFB<0.05 V and VOVP>1.7 V and an LED open protection release condition is an EN input or a UVLO release. Operation during an LED open protection detection time is a shutdown of all the blocks (other than the REG). An LED short-circuit protection detection condition is |LEDR−LEDC|≥0.2 V (at 100 ms delay, 300 kHZ) and an LED short-circuit protection release condition is an EN input or a UVLO release. Operation during an LED short-circuit protection detection time is latching-off (other than the REG) after a predetermined time counted by a delay counter.

<Power-Source Turning-On Sequence>

Figure 12:
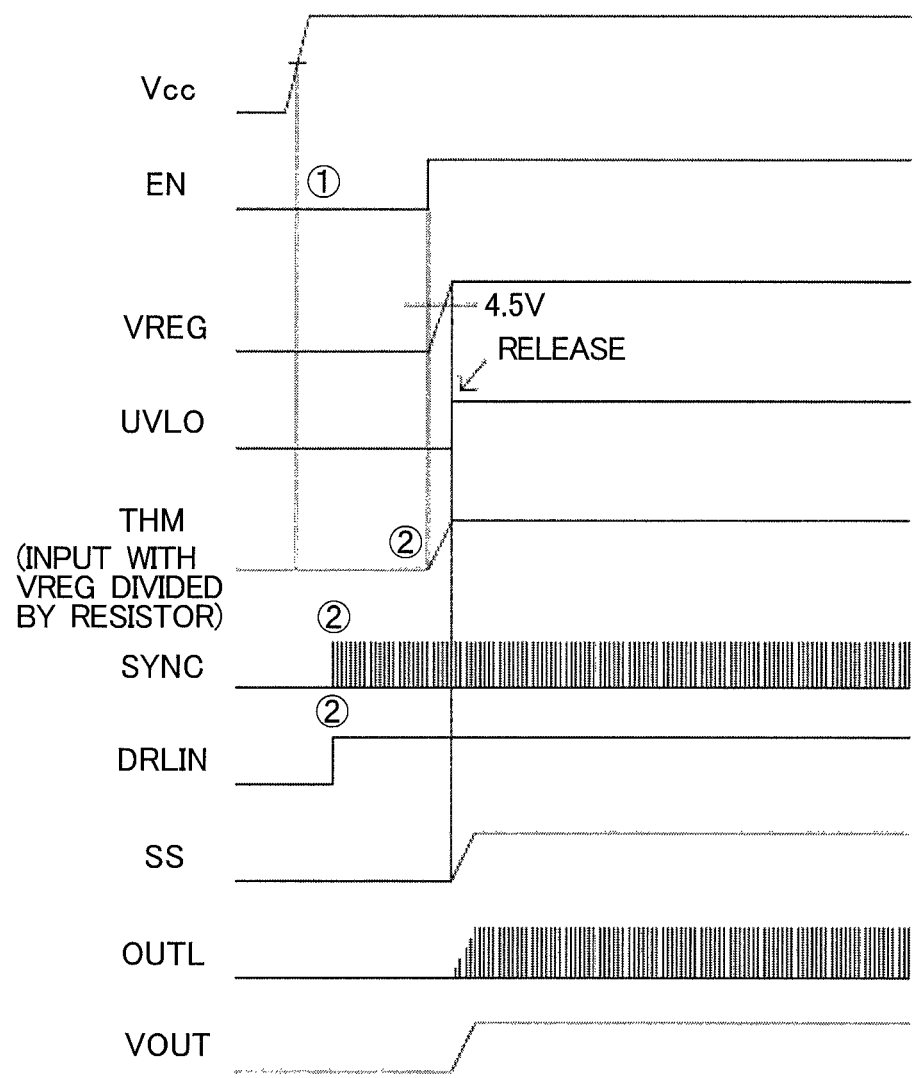
FIG. 12 is a time chart for describing a power-supply turning on sequence.

FIG. 12 is a time chart for describing a power-supply turning-on sequence. (1) After the VCC application, it is desirable to input the EN at VCC≥4.5 V. (2) Before the EN input, it is desirable to fix potentials of the DRLIN terminal and the THM terminal (3) The soft start operates simultaneously with the EN input, and a switching output is performed. (4) In a case where the external PWM signal input is performed using the VTH terminal, after the VCC input, an order of the other inputs is unquestioned.

<Operation During LED Trouble Time>

[LED Open Detection Function]

Figure 13:
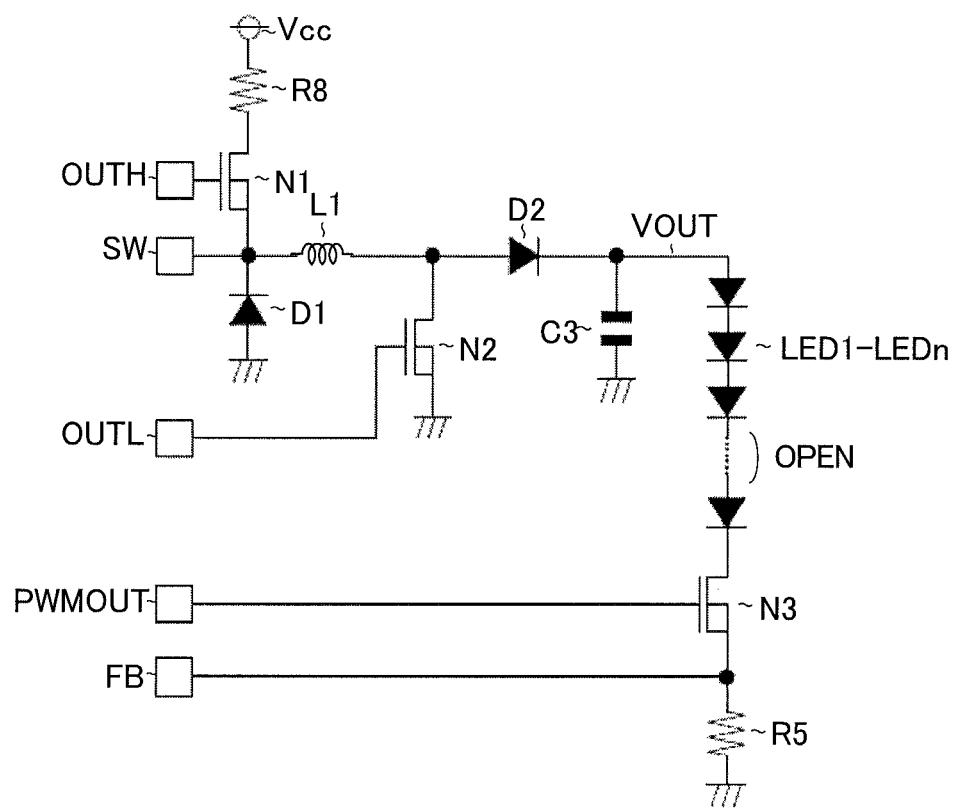
FIG. 13 is a circuit diagram for describing an LED open detection function.
Figure 14:
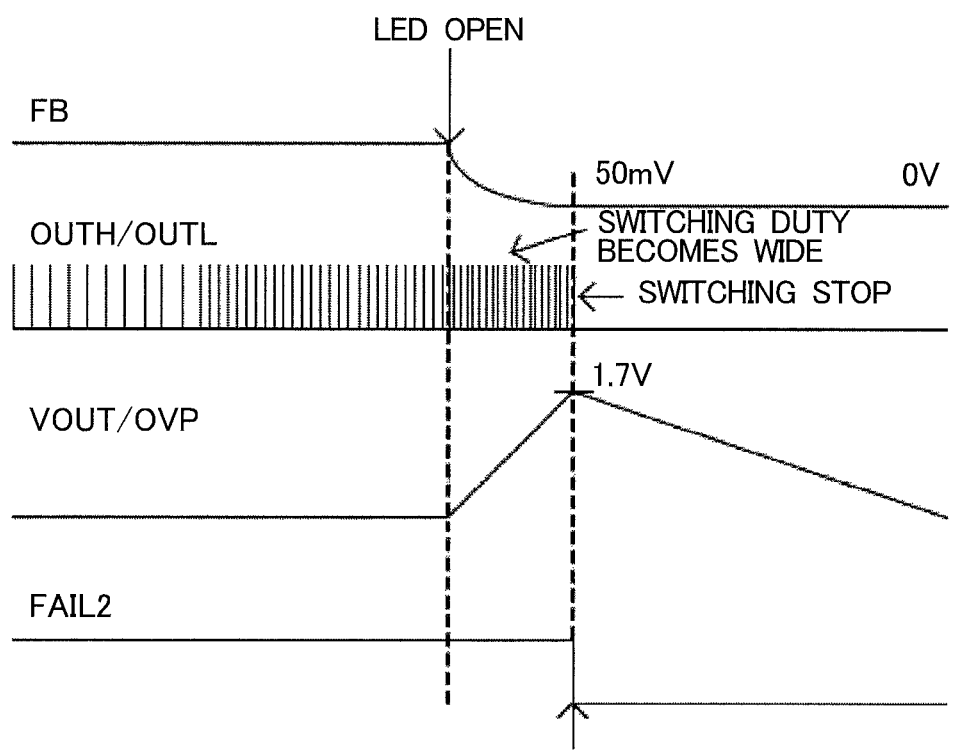
FIG. 14 is a time chart for describing an LED open detection function.

FIG. 13 is a circuit diagram for describing an LED open detection function, and FIG. 14 is a time chart for describing the LED open detection function. When an LED open occurs, a switching duty becomes wide and the FB terminal voltage VFB drops. And, when a detection condition of VOVP≥1.7 V and VFB≤50 mV is met, the LED open is detected, the FAIL2 terminal is brought to the low level, and the shutdown of all the blocks (other than the REG) is performed.

[LED Short-Circuit Detection Function]

Figure 15:
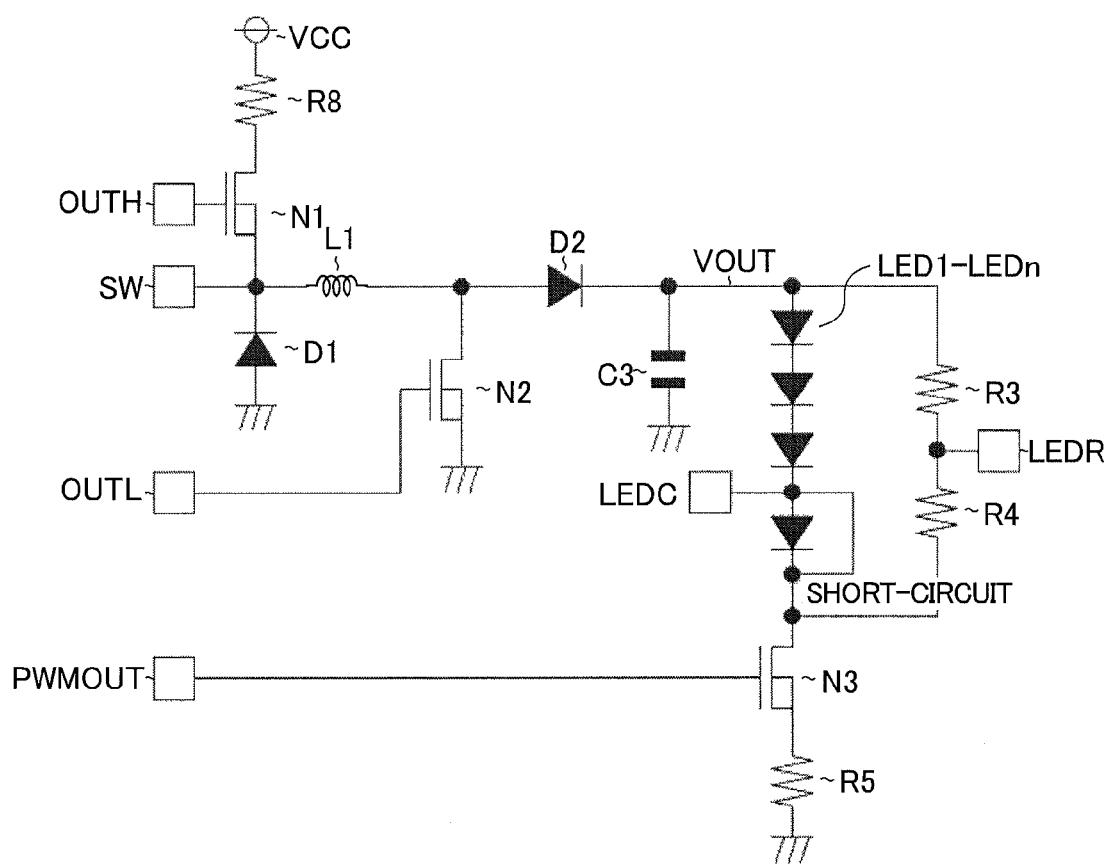
FIG. 15 is a circuit diagram for describing an LED short-circuit detection function.
Figure 16:
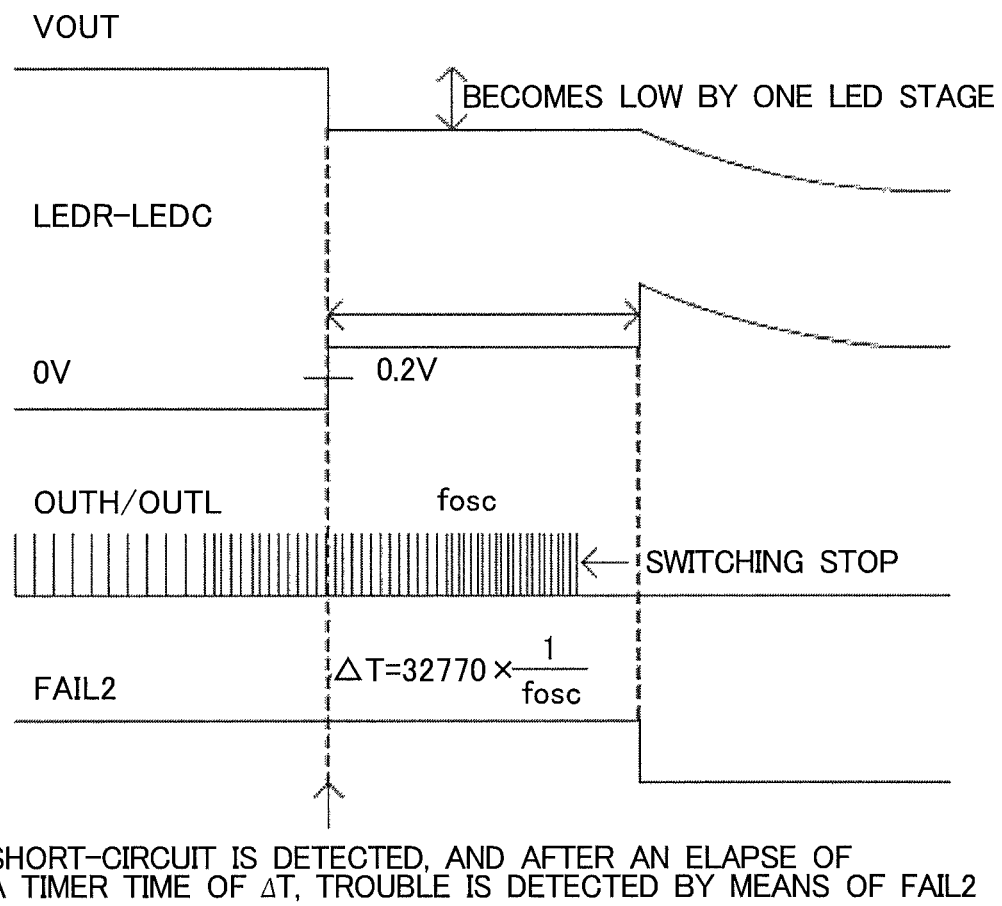
FIG. 16 is a time chart for describing an LED short-circuit detection function.

FIG. 15 is a circuit diagram for describing an LED short-circuit detection function, and FIG. 16 is a time chart for describing the LED short-circuit detection function. When an LED short-circuit occurs; the output voltage Vout becomes low by a voltage of one LED stage; and a detection condition |LEDR−LEDC|≥0.2 V is met, after an elapse of a timer time ΔT (=32770×(1/FOSC)), the FAIL2 terminal is brought to the low level.

[LED Anode/Cathode Ground Short-Circuit Detection]

Figure 17:
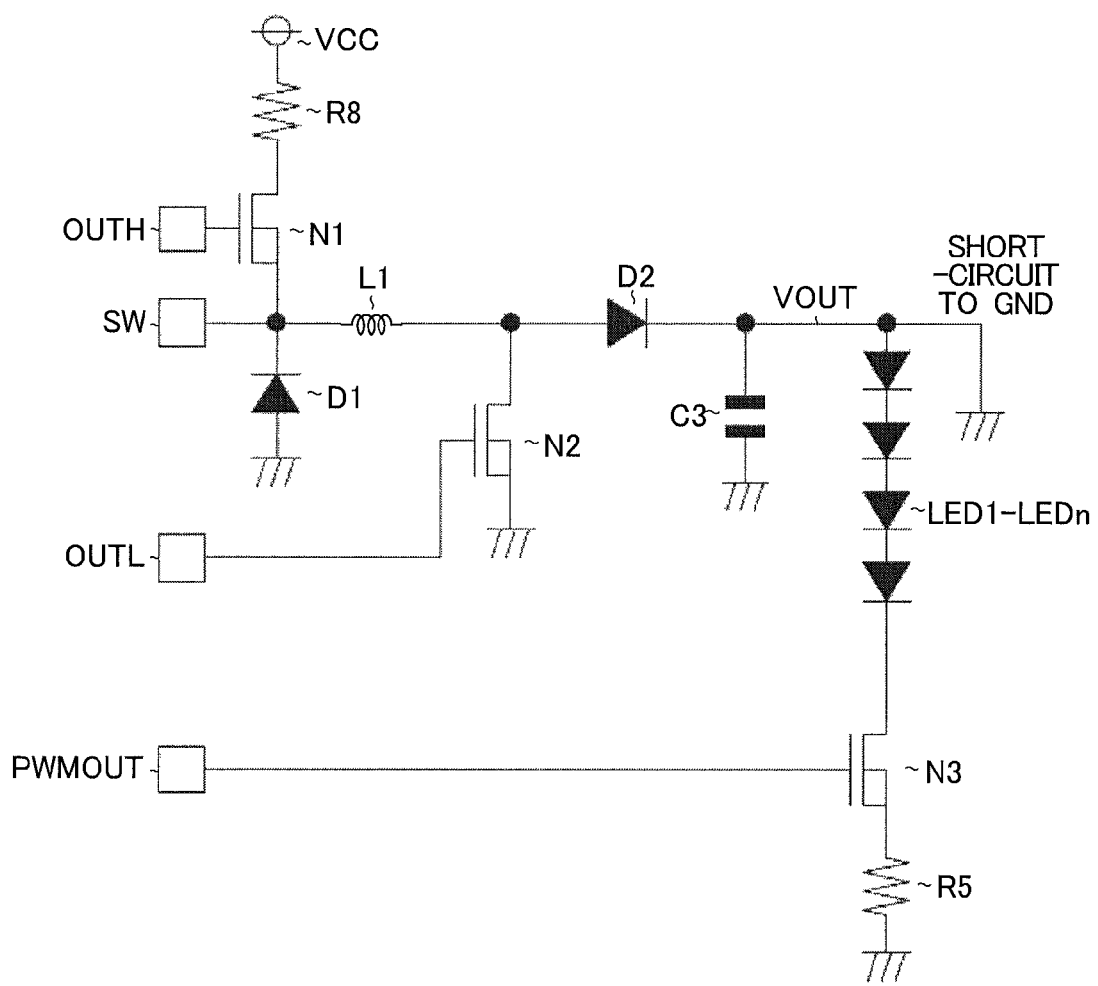
FIG. 17 is a circuit diagram for describing an LED anode/cathode ground short-circuit detection function.
Figure 18:
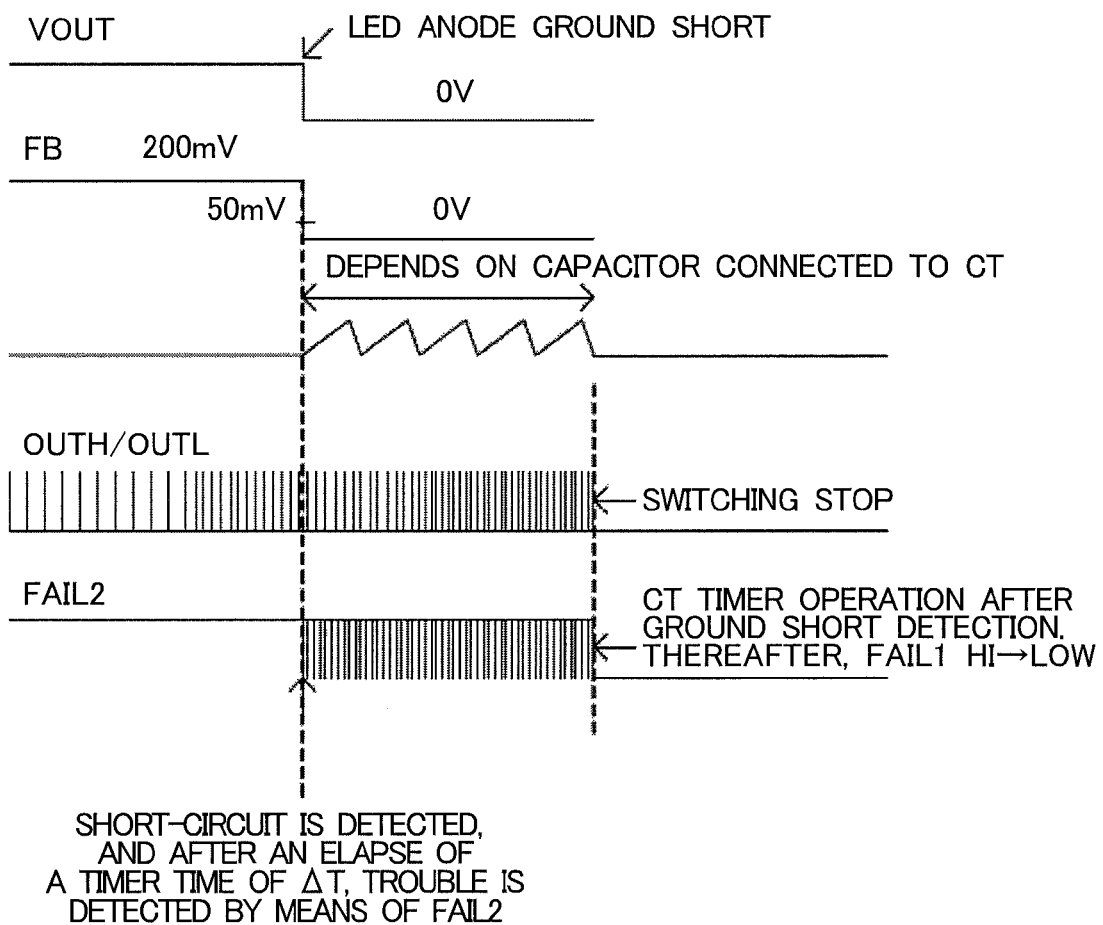
FIG. 18 is a time chart for describing an LED anode/cathode ground short circuit detection function.

FIG. 17 is a circuit diagram for describing an LED anode/cathode ground short-circuit detection function, and FIG. 18 is a time chart for describing the LED anode/cathode ground short-circuit detection function. When a short-circuit (Vout=0

V) of the LED anode to the ground occurs and the FB terminal voltage VFB becomes 0 V, after an elapse of a timer time ΔT (which depends on a capacitance value of the capacitor C9 connected to the CT terminal), the switching of the OUTH/OUTL is stopped and the FAIL1 terminal is brought to the low level.

<Second Structural Example>

FIG. 19 is a circuit block diagram showing a second structural example (voltage step-down application structure) of the LED driver IC 100. In the second structural example, to achieve a voltage step-down application, the transistor N2 and the Zener diode D2 in FIG. 1 are removed. Besides, in the second structural example, a connection example is shown, in which instead of the thermistor resistor R13 in FIG. 1, the two external transistors Q1 and Q2 are used, whereby a derating function for the LED current is achieved by means of a two-input selector structure (INP1, INP2).

<Third Structural Example>

Figure 20:
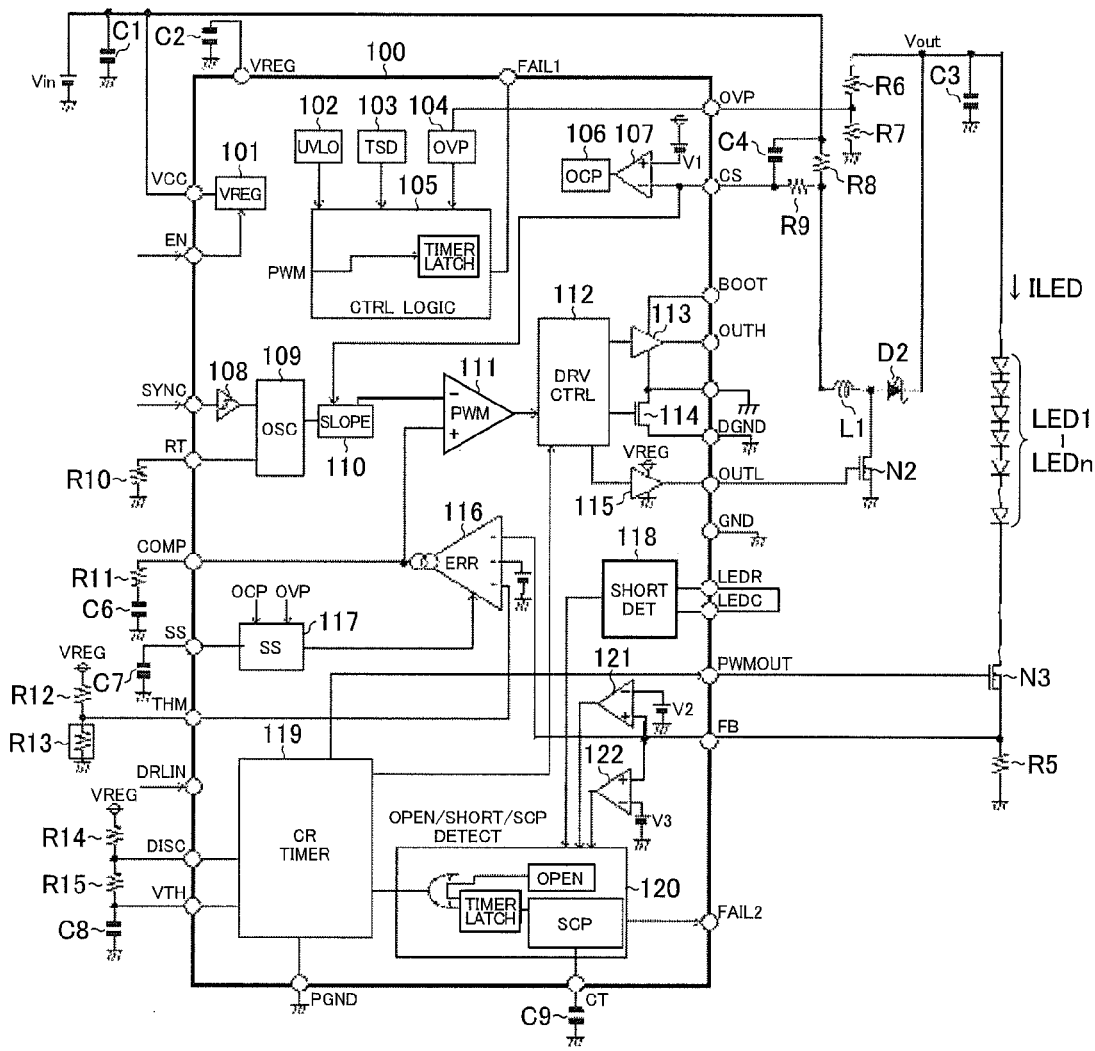
FIG. 20 is a circuit block diagram showing a third structural example (voltage step-up application structural example) of the LED driver IC 100.

FIG. 20 is a circuit block diagram showing a third structural example (voltage step-up application structure) of the LED driver IC 100. In the third structural example, to achieve a voltage step-up application, the transistor N1, the Zener diode D1 and the capacitor C5 in FIG. 1 are removed. Besides, in the third structural example, the SW terminal is connected to the ground terminal. Besides, in the third structural example, a connection example for invalidating the LED short-circuit detection function is shown. Specifically, the resistors R1 to R4 in FIG. 1 are removed, and the LEDR terminal and the LEDC terminal are shorted to each other.

<Details of LED Short-Circuit Detection Portion>

Figure 21:
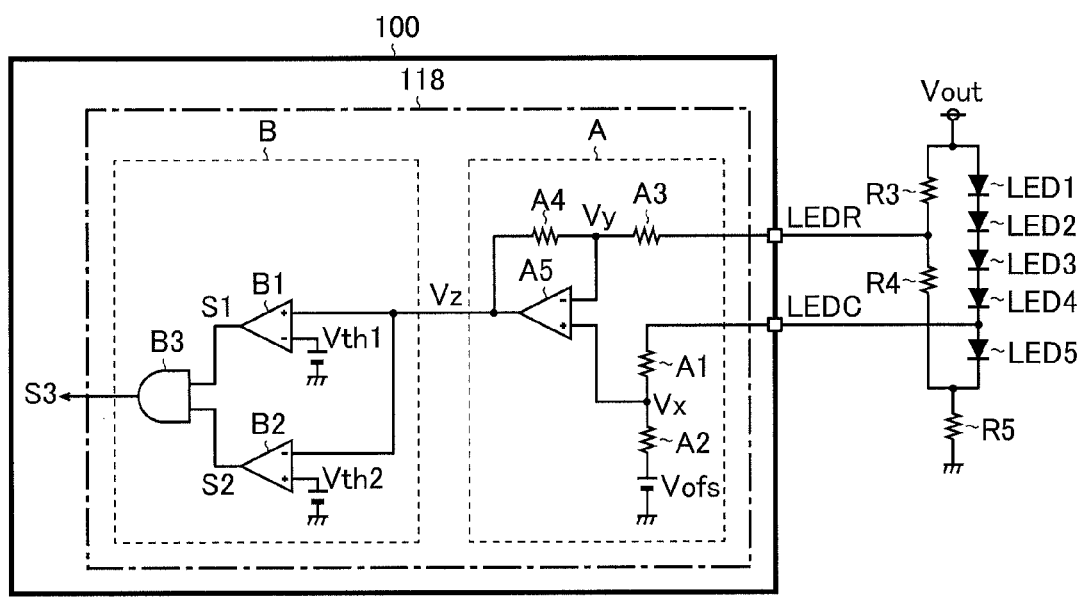
FIG. 21 is a circuit diagram showing a structural example of an LED short-circuit detection portion 118.

FIG. 21 is a circuit diagram showing a structural example of the LED short-circuit detection portion 118. The LED short-circuit detection portion 118 of the present structural example is a circuit block that monitors the LEDC terminal voltage (a first voltage obtained at a between-chips node of the LED chip line of LED1 to LED5 or a divided voltage of the first voltage) and the LEDR terminal voltage (a second voltage obtained by dividing a voltage across the LED chip line of LED1 to LED5) to generate an LED short-circuit detection signal S3, and has a differential circuit A and a comparison circuit B.

Here, in the LED short-circuit detection portion 118 of the present structural example, the first voltage input as the LEDC terminal voltage is a voltage obtained at a between-chips node (between-chips node between the LED 4 and the LED5) that divides the five LED chips LED1 to LED5 (in the present structural example, all the chips are of single chip type) included in the LED chip line into 4:1. Besides, the second voltage input as the LEDR terminal voltage is a voltage obtained by dividing the voltage across the LED chip line of LED1 to LED5 into 4:1.

The differential circuit A is a circuit block that generates a voltage signal Vz in accordance with a difference between the LEDC terminal voltage and the LEDR terminal voltage, and includes resistors A1 to A4 and an operational amplifier A5. A first terminal of the resistor A1 is connected to the LEDC terminal. A second terminal of the resistor A1 and a first terminal of the resistor A2 are, as application terminals for a voltage signal Vx, connected to a non-inverting input terminal (+) of the operational amplifier A5. A second terminal of the resistor A2 is connected to an application terminal for an offset voltage Vofs. A first terminal of the resistor A3 is connected to the LEDR terminal. A second terminal of the resistor A3 and a first terminal of the resistor A4 are, as application terminals for a voltage signal Vy, connected to an inverting input terminal (−) of the operational amplifier A5. A second terminal of the resistor A4 is connected to an output terminal of the operational amplifier A5. The output terminal of the operational amplifier A5 is, as an output terminal for the voltage signal Vz, connected to an input terminal of the comparison circuit B.

The comparison circuit B is a circuit block that changes a logical level of the LED short-circuit detection signal S3 in accordance with whether the voltage signal Vz falls in a predetermined range (Vth1<Vz<Vth2) or not, and includes comparators B1, B2 and an AND gate B3. A non-inverting input terminal (+) of the comparator B1 and an inverting input terminal (−) of the comparator B2 are both connected to the application terminal for the voltage signal Vz. An inverting input terminal (−) of the comparator B1 is connected to an application terminal for a threshold voltage Vth1. A non-inverting input terminal (+) of the comparator B2 is connected to an application terminal for a threshold voltage Vth2. A first input terminal of the AND gate B3 is connected to an output terminal (application terminal for a comparison signal S1) of the comparator B1. A second input terminal of the AND gate B3 is connected to an output terminal (application terminal for a comparison signal S2) of the comparator B2. An output terminal of the AND gate B3 is connected to an output terminal for the LED short-circuit detection signal S3.

In other words, the comparator B1 compares the voltage signal Vz and the threshold voltage Vth1 with each other to generate the comparison signal S1. Here, the comparison signal S1 goes to a high level when the voltage signal Vz is higher than the threshold voltage Vth1 and goes to a low level when the voltage signal Vz is lower than the threshold voltage Vth1.

On the other hand, the comparator B2 compares the voltage signal Vz and the threshold voltage Vth2 with each other to generate the comparison signal S2. Here, the comparison signal S2 goes to a low level when the voltage signal Vz is higher than the threshold voltage Vth2 and goes to a high level when the voltage signal Vz is lower than the threshold voltage Vth2.

The AND gate B3 calculates a logical product of the comparison signal S1 and the comparison signal S2 to generate the LED short-circuit detection signal S3. Here, the LED short-circuit detection signal S3 goes to a high level (logical level during a usual time) when both of the comparison signal S1 and the comparison signal S2 are in the high level, and goes to a low level (logical level during an unusual time) when at least one of the comparison signal S1 and the comparison signal S2 is in the low level.

Operation of the LED short-circuit detection portion 118 having the above structure is described in detail using a specific example. Incidentally, hereinafter, description is performed under condition that the forward drop voltage of each of the LED1 to the LED5, that is, VF=3 V, A1 to A4=100 kΩ, Vofs=2 V, Vth1=1.8 V, and Vth2=2.2 V.

In a case where an across-terminal short-circuit does not occur across any one of the LED1 to LED5, the output voltage Vout becomes 15 V (=3 V×5 stages). At this time, both of the LEDC terminal voltage and the LEDR terminal voltage become 3 V (LEDC=VF, LEDR=Vout (15 V)×(⅕)). Because the LEDC terminal voltage is 3 V, the voltage signal Vx becomes 2.5 V, and the operational amplifier A5 outputs 2 V as the voltage signal Vz in such a way that the voltage signal Vy becomes equal to the voltage signal Vx (imaginary short). Accordingly, both of the comparison signals S1 and S2 go to the high level, so that the LED detection signal S3 goes to the high level.

On the other hand, in a case where an across-terminal short-circuit occurs across any one of the LED1 to LED4 of the LED chip line of the LED1 to LED5, the output voltage Vout becomes 12 V (=3 V×4 stages). At this time, the LEDC terminal voltage becomes 3 V (=VF) and the LEDR terminal voltage becomes 2.4 V (=Vout (12 V)×(1/5)). Because the LEDC terminal voltage is 3 V, the voltage signal Vx becomes 2.5 V, and the operational amplifier A5 outputs 2.6 V as the voltage signal Vz in such a way that the voltage signal Vy becomes equal to the voltage signal Vx (imaginary short). Accordingly, the comparison signal S1 goes to the high level and the comparison signal S2 goes to the low level, so that the LED detection signal S3 goes to the low level.

Beside, in a case where an across-terminal short-circuit occurs across the LED5 of the LED chip line of the LED1 to LED5, the output voltage Vout becomes 12 V (=3 V×4 stages). At this time, the LEDC terminal voltage becomes nearly 0 V (=GND) and the LEDR terminal voltage becomes 2.4 V (=Vout (12 V)×(1/5)). Because the LEDC terminal voltage is nearly 0 V, the voltage signal Vx becomes nearly 1 V, and the operational amplifier A5 outputs 0.4 V as the voltage signal Vz in such a way that the voltage signal Vy becomes equal to the voltage signal Vx (imaginary short). Accordingly, the comparison signal S1 goes to the low level and the comparison signal S2 goes to the high level, so that the LED detection signal S3 goes to the low level.

As described above, the LED short-circuit detection portion 118 of the present structural example has a structure that detects the LED short-circuit not by using a conventional detection method which uses an absolute value but by using a detection method which uses an relative value, so that it is possible to obtain advantages such as (1) reduction in the external components, (2) unnecessary adjustment during the inspection process, (3) increase in the LED short-circuit detection accuracy (reduction in the influence of the LED temperature characteristic) and the like.

<Other Variations>

Here, in the above embodiments, the structures, in which the present invention is applied to the vehicle lamp white LED driver, are described as examples; however, the application target of the present invention is not limited to this, and is widely applicable to general LED drive devices that are used for other applications.

Besides, the structure according to the present invention, besides the above embodiments, is variously modifiable without departing from the spirit of the present invention. In other words, it should be understood that the above embodiments are examples in all respects and are not limiting, and the technological scope of the present invention is not indicated by the above description of the embodiments but by the claims, and all modifications within the scope of the claims and the meaning equivalent to the claims are covered.

INDUSTRIAL APPLICABILITY

The LED drive device according to the present invention is preferably usable as a drive means for, for example, a vehicle head light, daytime and night running (DRL) light source, a rear lamp, a stop lamp, a turn signal lamp and the like.

LIST OF REFERENCE NUMERALS

100 LED driver IC (LED drive device)
101 internal constant voltage generation portion
102 UVLO portion
103 TSD portion
104 OVP portion
105 control logic portion
106 OCP portion
107 comparator
108 Schmitt trigger
109 oscillation portion
110 slope generation portion
111 PWM comparator
112 driver control portion
113 high-side driver
114 N channel MOS field effect transistor
115 low-side driver
116 error lamp
117 soft start portion
118 LED short-circuit detection portion
119 CR timer portion
120 various trouble detection portion
121, 122 comparators
N1 to N3 N channel MOS field effect transistors
R1 to R15 resistors
C1 to C9 capacitors
D1, D2 Zener diodes
L1 inductor
LED1 to LEDn light emitting diodes
LED line of light emitting diodes
Q1, Q2 pnp bipolar transistors
A differential circuit
A1 to A4 resistors
A5 operational amplifier
B comparison circuit
B1, B2 comparators
B3 AND gate
X10 vehicle
X11 head light
X12 daytime and night running (DRL) light source
X13 tail lamp
X14 stop lamp
X15 turn signal lamp
X21 N channel MOS field effect transistor
X22 NAND gate
X23 SR flip-flop
X24 counter
X31 N channel MOS field effect transistor
X32 SR flip-flop
X33, X34 AND gates
Y10 LED head light module
Y20 LED turn signal lamp module
Y30 LED rear lamp module
MCLED high brightness light emitting diode (multi-chip)
SCLED light emitting diode (single chip)

The invention claimed is:

1. An LED short-circuit detection circuit comprising:
a differential circuit outputting a differential voltage indicating a difference of a first voltage and a second voltage, the first voltage being obtained by a connection point of voltage between a first light emitting diode and a second light emitting diode of an LED chip line formed by connecting a plurality of light emitting diodes in series with each other, and the second voltage being obtained by dividing a forward drop voltage of the LED chip line; and
a detection circuit to receive the differential voltage and determine whether the differential voltage falls in a predetermined range,
wherein, if the differential voltage does not fall in the predetermined range, the detection circuit detects a short-circuit between one anode of the LED chip line and other anode of the LED chip line, or a short-circuit between an anode of one light emitting diode in the LED chip line and a cathode of the one light emitting diode, and outputs an LED short-circuit detection signal.

2. The LED short-circuit detection circuit according to claim 1, wherein the differential circuit includes:
   a first resistor a first terminal of which is connected to an application terminal of the first voltage or the divided voltage thereof;
   a second resistor a first terminal of which is connected to a second terminal of the first resistor;
   a third resistor a first terminal of which is connected to an application terminal for the second voltage;
   a fourth resistor a first terminal of which is connected to a second terminal of the third resistor; and
   an operational amplifier a first input terminal of which is connected to a connection node between the first resistor and the second resistor, a second input terminal of which is connected to a connection node between the third resistor and the fourth resistor, and an output terminal of which is connected to a second terminal of the fourth resistor and to an output terminal for the differential voltage.

3. The LED short-circuit detection circuit according to claim 2, wherein a second terminal of the second resistor is connected to an application terminal for an offset voltage.

4. The LED short-circuit detection circuit according to claim 1, wherein the detection circuit includes:
   a first comparator that compares the differential voltage and a first threshold voltage with each other to generate a first comparison signal;
   a second comparator that compares the differential voltage and a second threshold voltage with each other to generate a second comparison signal; and
   a logical gate that logically combines the first comparison signal and the second comparison signal with each other to generate the LED short-circuit detection signal.

5. The LED short-circuit detection circuit according to claim 1, wherein the first voltage is a voltage obtained at a between-chips node that divides n LED chips included in the LED chip line into (n−1):1.

6. An LED drive device that integrates into a semiconductor device:
   a drive circuit that drives the LED chip line; and
   an LED short-circuit detection circuit of claim 1.

* * * * *